US011316027B2

United States Patent
Chang et al.

(10) Patent No.: US 11,316,027 B2
(45) Date of Patent: Apr. 26, 2022

(54) RELAXOR FERROELECTRIC CAPACITORS AND METHODS OF FABRICATION

(71) Applicant: Intel Corporation, Santa Clara, CA (US)

(72) Inventors: Sou-Chi Chang, Portland, OR (US); Chia-Ching Lin, Portland, OR (US); Nazila Haratipour, Hillsboro, OR (US); Tanay Gosavi, Hillsboro, OR (US); I-Cheng Tung, Hillsboro, OR (US); Seung Hoon Sung, Portland, OR (US); Ian Young, Portland, OR (US); Jack Kavalieros, Portland, OR (US); Uygar Avci, Portland, OR (US); Ashish Verma Penumatcha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 16/833,375

(22) Filed: Mar. 27, 2020

(65) Prior Publication Data

US 2021/0305398 A1    Sep. 30, 2021

(51) Int. Cl.
*H01L 21/02* (2006.01)
*H01L 29/51* (2006.01)
*H01L 29/24* (2006.01)
*H01L 29/92* (2006.01)

(52) U.S. Cl.
CPC .......... *H01L 29/516* (2013.01); *H01L 29/245* (2013.01); *H01L 29/92* (2013.01)

(58) Field of Classification Search
CPC ..... H01L 29/516; H01L 29/245; H01L 29/92; H01L 29/02; H01L 27/11502–11514; H01L 27/0629; H01L 27/0676; H01L 27/0682; H01L 27/0716; H01L 27/0722; H01L 27/0727; H01L 27/0733; H01L 27/0788; H01L 27/0794; H01L 27/0805; H01L 27/101; H01L 27/1255; H01L 27/3265
USPC ....................................................... 257/295
See application file for complete search history.

(56) References Cited

U.S. PATENT DOCUMENTS

2021/0202510 A1* 7/2021 Thareja et al.

\* cited by examiner

*Primary Examiner* — Calvin Y Choi
(74) *Attorney, Agent, or Firm* — Essential Patents Group, LLP

(57) ABSTRACT

A capacitor device includes a first electrode having a first metal alloy or a metal oxide, a relaxor ferroelectric layer adjacent to the first electrode, where the ferroelectric layer includes oxygen and two or more of lead, barium, manganese, zirconium, titanium, iron, bismuth, strontium, neodymium, potassium, or niobium and a second electrode coupled with the relaxor ferroelectric layer, where the second electrode includes a second metal alloy or a second metal oxide.

20 Claims, 13 Drawing Sheets

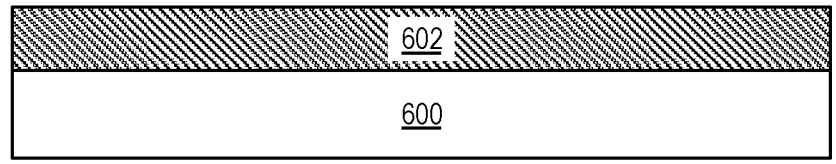
FIG. 6A
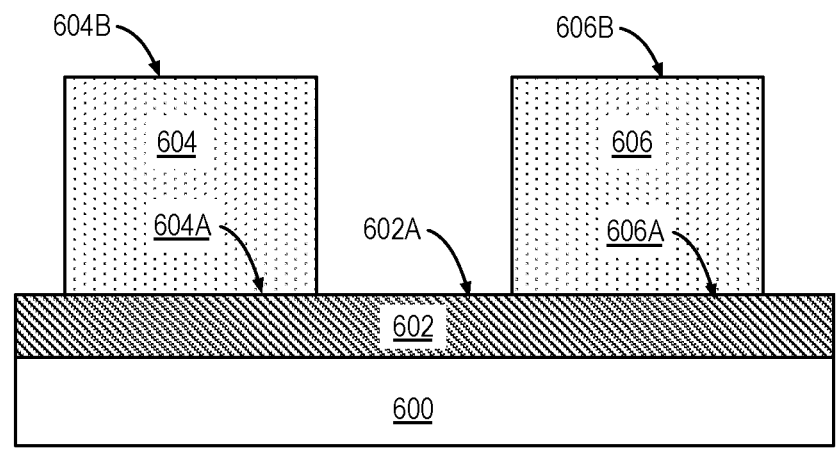
FIG. 6B
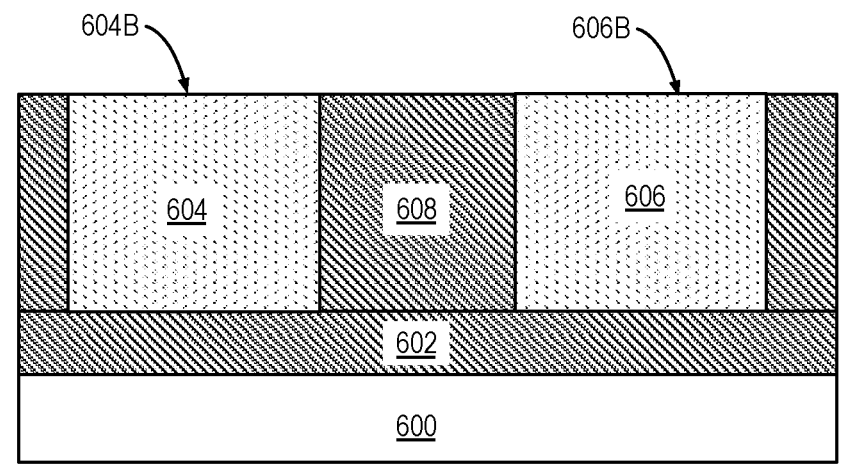
FIG. 6C
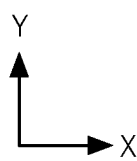

US 11,316,027 B2

RELAXOR FERROELECTRIC CAPACITORS AND METHODS OF FABRICATION

BACKGROUND

Generally, ferroelectric materials have a wide variety of applications in the modern electronic industry. Some examples of applications of ferroelectric materials include usage in capacitors and transistors. Capacitors in integrated circuits can be utilized for creating memory devices or for circuit decoupling. Ferroelectric materials may be utilized for increasing the capacitance or for reducing leakage current density in these applications. Therefore, there is a continuing need for improving capacitance by utilizing materials that enable higher dielectric strengths while minimizing leakage current

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 6A illustrates a first conductive interconnect layer formed above a substrate.

FIG. 6B illustrates the structure of FIG. 6A following the formation of dummy structures on the first conductive interconnect layer, in accordance with an embodiment of the present disclosure.

FIG. 6C illustrates the structure of FIG. 6B following the formation of a second conductive interconnect layer on the first conductive interconnect layer and adjacent to the dummy structures.

DESCRIPTION OF THE EMBODIMENTS

Figure 1A:
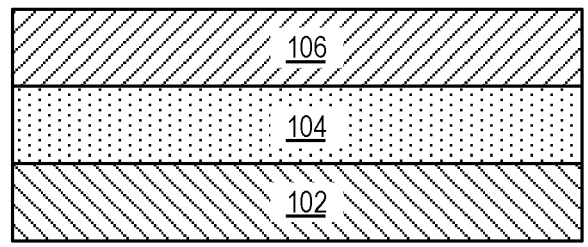
FIG. 1A illustrates a cross-sectional view of a capacitor including a relaxor ferroelectric layer, in accordance with an embodiment of the present disclosure.

Various capacitor devices with one or more relaxor ferroelectric materials and capping schemes are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with capacitors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

A metal-insulator-metal (MIM) capacitor can be utilized in a variety of applications such as for decoupling capacitance in high power microprocessor units, in radio frequency circuits and in other analog integrated circuit devices. A decoupling capacitor, for example, provides a bypass path for transient currents in the circuit. Transient currents can ordinarily damage active electronic devices such as transistors. A decoupling capacitor can also provide power to an integrated circuit and keep the power supply voltage stable. The decoupling capacitor does this by absorbing excess electrical energy (charge) flowing through the circuit. It is desirable for a decoupling capacitor to have a sufficiently large capacitance, such as a capacitance above 8 microfarads/cm$^2$, to control the excess electrical energy and provide a stable power supply voltage. A large capacitance can be obtained when an insulator in a MIM capacitor has a high dielectric constant. A dielectric constant above 20 may be considered to be high. Typical dielectric constants of known dielectric materials such as oxides of hafnium, aluminum or zirconium are in the range of 25-35. The leakage current of MIM capacitors that utilize these dielectric materials are in the range of $10^{-6}$ to $10^{-3}$ A/cm$^2$. Capacitance of MIM capacitors that utilize one or more traditional dielectric materials can be increased by reducing the thickness of the one or more dielectric materials. However, decreasing a total thickness of the one or more dielectric materials can lead to an exponential increase in the leakage current.

By implementing a material with a dielectric strength that is substantially greater than 50, the capacitance in a MIM capacitor can be increased without reducing the thickness of the dielectric material. Increasing the capacitance enables the MIM capacitor to absorb a greater amount of energy during a transient discharge, for example. One class of materials which has a high dielectric constant is called a relaxor ferroelectric. Relaxor ferroelectric materials have a dielectric permittivity (related to the dielectric constant) that is dependent on temperature of the material. The peak dielectric permittivity is near a Curie temperature of the material.

A relaxor ferroelectric material has self-assembled domains of electric dipoles that are oriented in a particular direction. The domains have a short-range ordering that is in the range of 2 nm to 10 nm. The electric dipoles, in domains where the short-range ordering is in the range of 2 nm to 10 nm, can be easily re-oriented (or flipped) towards a desired direction by a weak externally applied electric field. The electric field may be applied by biasing two electrodes of the MIM capacitor directly adjacent to the relaxor ferroelectric material. The magnitude of the externally applied electric field is substantially less compared to a magnitude of the electric field required to re-orient electric dipoles in a ferroelectric material. A larger field may be required because domains in a ferroelectric material are macroscopic in scale (order of several microns for example).

Another importance characteristics of the relaxor ferroelectric material is that the peak dielectric constant exhibits a dependence on a frequency of the applied external electric field. Typically, the peak dielectric constant shifts and decreases with increasing frequency. Dependence of the peak dielectric constant on applied electric field frequency and temperature enables a relaxor ferroelectric material to be used in a broad range of integrated circuit applications.

In accordance with an embodiment of the present disclosure, a capacitor device includes a first electrode having a first metal alloy or a metal oxide, a ferroelectric layer adjacent to the first electrode, where the ferroelectric layer includes oxygen and two or more of lead, barium, manganese, zirconium, titanium, iron, bismuth, strontium, neodymium, or niobium and a second electrode coupled with the ferroelectric layer, where the second electrode includes a second metal alloy or a second metal oxide. In an exemplary embodiment, the ferroelectric layer is a relaxor ferroelectric layer. In an embodiment, the capacitor is a planar MIM capacitor. In other embodiments, the capacitor is a trench capacitor, where the first electrode is adjacent to a sidewall and on a base of a via, and where the ferroelectric layer is conformal with the first electrode and further where the second electrode is conformal with the ferroelectric layer. In some embodiments, the MIM capacitor may include a stack having two or more ferroelectric layers, where at least one ferroelectric layer is a relaxor ferroelectric layer. In some such embodiments, all layers in the stack are relaxor ferroelectric layers.

FIG. 1A is an illustration of a cross-sectional view of a capacitor device 100A in accordance with an embodiment of the present disclosure. The capacitor 100A includes a first electrode 102 having a first metal alloy or a metal oxide and a ferroelectric layer 104 adjacent to the electrode 102. As shown ferroelectric layer 104 includes a relaxor ferroelectric material and may be referred to as a relaxor ferroelectric layer 104. The relaxor ferroelectric layer 104 includes oxygen and two or more of lead, barium, manganese, zirconium, titanium, iron, bismuth, strontium, neodymium, or niobium. A second electrode 106 is coupled with the relaxor ferroelectric layer 104, where the electrode 106 includes a second metal alloy or a second metal oxide. As shown the capacitor device 100A is an example of a planar metal-insulator-metal device.

In an embodiment, the relaxor ferroelectric layer 104 includes a combination of lead, niobium, oxygen, and one of magnesium or zirconium. In one embodiment, relaxor ferroelectric layer 104 includes a perovskite compound with a chemical formula ABO$_3$, where "A" is a first element and "B" is a second element or a compound. In one embodiment, the perovskite compounds are B-site substituted where the element "A" is lead. In some such examples, B-site substitutions include a combination of niobium and at least one of magnesium or zirconium. In embodiments, relaxor ferroelectric layer 104 includes PbMg$_x$Nb$_{1-x}$O$_3$ where x is between ⅓ to ⅔ or PbZr$_x$Nb$_{1-x}$O$_3$ where x is between ⅓ to ⅔.

In other embodiments, the perovskite compound is doped with other compounds. For example, the relaxor ferroelectric layer 104 may include a first combination of Pb, Mg, Nb and O, and a second combination of Pb, Ti and O. In exemplary embodiments, the atomic percent of Mg and Nb in the relaxor ferroelectric layer 104 is greater than an atomic percent of the Ti in the relaxor ferroelectric layer 104. In an embodiment, the relative ratio of the atoms with respect to each other corresponds to that which would be present in a solid solution of [Y]PbMg$_x$Nb$_{1-x}$-[Z]PbTiO$_3$ (e.g., a solid solution in relaxor ferroelectric layer 104), where x is between ⅓ and ⅔, and where "Y" denotes a concentration of the PbMg$_x$Nb$_{1-x}$O$_3$ in the solid solution, and where "Z" denotes a concentration of the PbTiO$_3$ in the solid solution. Depending on embodiments, the concentration of the PbMg$_x$Nb$_{1-x}$O$_3$ is up to 100% greater than the concentration of the PbTiO$_3$. In an embodiment, "Y" is 0.68 and "Z" is 0.32.

In another embodiment, the dopants include a combination of barium and titanium. In an embodiment, the relaxor ferroelectric layer 104 includes a first combination of Pb, Mg, Nb and O, and a second combination of Ba, Ti and O. In exemplary embodiments, the atomic percent of Pb, Mg, Nb in the relaxor ferroelectric layer 104 is greater than an atomic percent of Ba and Ti in the relaxor ferroelectric layer 104. The relative ratio of the atoms with respect to each other corresponds to that which would be present in a solid solution of [Y]PbMg$_x$Nb$_{1-x}$O$_3$[Z]BaTiO$_3$ (e.g., a solid solution in relaxor ferroelectric layer 104), where x is between ⅓ and ⅔, and where "Y" denotes a concentration of the $PbMg_xNb_{1-x}O_3$ in the solid solution, and where "Z" denotes a concentration of the $BaTiO_3$ in the solid solution. Depending on embodiments, concentration of the $PbMg_xNb_{1-x}O_3$ is up to 100% greater than the concentration of the $BaTiO_3$. In an embodiment, "Y" is 0.68 and "Z" is 0.32.

In another embodiment, the dopants include a combination of bismuth and iron. In an embodiment, the relaxor ferroelectric layer 104 includes a first combination of Pb, Mg, Nb and O, and a second combination of Bi, Fe and O. In exemplary embodiments, the atomic percent of Pb, Mg, Nb in the relaxor ferroelectric layer 104 is greater than an atomic percent of Bi and Fe in the relaxor ferroelectric layer 104. The relative ratio of the atoms with respect to each other corresponds to that which would be present in a solid solution of $[Y]PbMg_xNb_{1-x}O_3[B]BiFeO_3$ (e.g., a solid solution in relaxor ferroelectric layer 104), where x is between ⅓ and ⅔, and where "Y" denotes a concentration of the $PbMg_xNb_{1-x}O_3$ in the solid solution, and where "Z" denotes a concentration of the $BiFeO_3$ in the solid solution. Depending on embodiments, concentration of the $PbMg_xNb_{1-x}O_3$ is up to 100% greater than the concentration of the $BiFeO_3$.

In another embodiment, the dopants include a combination of bismuth and iron. In an embodiment, the relaxor ferroelectric layer 104 includes a first combination of Pb, Mg, Nb and O, and a second combination of Pb, Zr and O. In exemplary embodiments, the atomic percent of Pb, Mg, Nb in the relaxor ferroelectric layer 104 is greater than an atomic percent of Zr in the relaxor ferroelectric layer 104. The relative ratio of the atoms with respect to each other corresponds to that which would be present in a solid solution of $[Y]PbMg_xNb_{1-x}O_3[Z]PbZrO_3$ (e.g., a solid solution in relaxor ferroelectric layer 104), where x is between ⅓ and ⅔, and where "Y" denotes a concentration of the $PbMgxNb_{1-x}O_3$ in the solid solution, and where "Z" denotes a concentration of the $BiFeO_3$ in the solid solution. Depending on embodiments, concentration of the $PbMg_xNb_{1-x}O_3$ is up to 100% greater than the concentration of the $PbZrO_3$.

In some embodiments, the relaxor ferroelectric layer 104 includes a combination of $PbMg_xNb_{1-x}O$, $BaTiO_3$, $PbTiO_3$, and $BiFeO_3$. The fractional volume of each compound in the relaxor ferroelectric layer 104 may be substantially the same or different.

In other embodiments the relaxor ferroelectric layer 104 includes bismuth, sodium, titanium and oxygen-based perovskite compounds. In some such embodiments, the relaxor ferroelectric layer 104 further includes two or more of barium, potassium, tantalum, antimony, zirconium, tin or niobium.

In a first example, the relaxor ferroelectric layer 104 includes a combination of Bi, Na, Ti and O, for e.g., $Bi_{0.5}Na_{0.5}TiO_3$.

In other embodiments, the relaxor ferroelectric layer 104 includes a first combination of Bi, Na, Ti and O and a second combination (and in some embodiments, a third combination) of dopants. In a second example, the relaxor ferroelectric layer 104 includes a first combination of Bi, Na, Ti and O, a second combination of Ba, Ti and O, and a third combination of K, Nb, Na and O. In one such embodiment, the relative ratio of the atoms with respect to each other corresponds to that which would be present in a solid solution of $(1-x)Bi_{0.5}Na_{0.5}TiO_3-(x)BaTiO_3$ (e.g., a solid solution in relaxor ferroelectric layer 104) —e.g., where x is between 0 and 0.1.

In a third example, the relaxor ferroelectric layer 104 includes a first combination of Bi, Na, Ti and O, a second combination of Ba, Ti and O, and a third combination of K, Nb, Na and O. In one such embodiment, the relative ratio of the atoms with respect to each other corresponds to that which would be present in a solid solution of (1-x-y) $Bi_{0.5}Na_{0.5}TiO_3-(x)BaTiO_3-(y)K_{0.5}Na_{0.5}NbO_3$ (e.g., a solid solution in relaxor ferroelectric layer 104) —e.g., where x is between 0 and 0.1, y is between 0 and 0.1.

In a fourth example, the relaxor ferroelectric layer 104 includes a first combination of Bi, Na, Ti and O, a second combination of Ba, Ti and O, and a third combination of a metal "M", such as Nb, Ta or Sb. The relative ratio of the atoms with respect to each other corresponds to that which would be present in a solid solution of $(1-x)(Bi_{0.5}Na_{0.5})-(x)BaTiO3-(y)M_2O_5$ (e.g., a solid solution in relaxor ferroelectric layer 104), where x is between 0 and 0.1, and y is between 0 and 0.1.

In a fifth example, the relaxor ferroelectric layer 104 includes Bi, a first combination of Na, and K, and a second combination of Ti, Sn and O. In one such embodiment, the relative ratio of the atoms with respect to each other corresponds to that which would be present in a solid solution of $Bi_{0.5}(Na_{0.75}K_{0.25})_{0.5}(Ti_{1-x}Sn_x)O_3$ (e.g., a solid solution in relaxor ferroelectric layer 104) —e.g., where x is 0, 0.02, 0.05, or 0.08.

In a sixth example, the relaxor ferroelectric layer 104 includes a first combination of Bi, Na, Ti and O, a second combination of Bi, K, Ti and O, and a third combination of K, Na, Nb, and O. In one such embodiment, the relative ratio of the atoms with respect to each other corresponds to that which would be present in a solid solution of (1-x-y) $Bi_{0.5}Na_{0.5}TiO_3-xBi_{0.5}K_{0.5}TiO_3-yK_{0.5}Na_{0.5}NbO_3$ (e.g., a solid solution in relaxor ferroelectric layer 104) —e.g., where x is between 0 and 0.2, and y is between 0 and 0.1

In a seventh example, the relaxor ferroelectric layer 104 includes a first combination of Bi, Na, Ti and O, a second combination of Ba, Ti and O, and a third combination of Sr, Ti and O. In one such embodiment, the relative ratio of the atoms with respect to each other corresponds to that which would be present in a solid solution of (1-x-y) $Bi_{0.5}Na_{0.5}TiO_3-(x)BaTiO_3-(y)SrTiO_3$ (e.g., a solid solution in relaxor ferroelectric layer 104) —e.g., where x is between 0 and 0.1, and y is between 0 and 1.

In an eighth example, the relaxor ferroelectric layer 104 includes a first combination of Bi, Na and K, Ti and O and a second combination of Ba, Zr and O. In one such embodiment, the relative ratio of the atoms with respect to each other corresponds to that which would be present in a solid solution of $(1-x)(Bi_{0.5}(Na_{0.82}K_{0.18})_{0.5}TiO_3)-(x)BaZrO_3$ (e.g., a solid solution in relaxor ferroelectric layer 104) —e.g., where x is between 0 and 0.05

In a ninth example, the relaxor ferroelectric layer 104 includes a first combination of Bi, Na, Ti and O and a second combination of K, Na, Nb and O. In one such embodiment, the relative ratio of the atoms with respect to each other corresponds to that which would be present in a solid solution of $(1-x)Bi_{0.5}Na_{0.5}TiO_3-(x)K_{0.5}Na_{0.5}NbO_3$ (e.g., a solid solution in relaxor ferroelectric layer 104) —e.g., where x is between 0 and 0.01

In an embodiment, the relaxor ferroelectric layer 104 includes a first combination of K, Nb, and O and a second combination of Nb, Na and O. In one such embodiment, the relative ratio of the atoms with respect to each other corresponds to that which would be present in a solid solution of $(1-x)KNbO_3-(x)NaNbO_3$ (e.g., a solid solution in relaxor ferroelectric layer 104) —e.g., where x is 0.5.

In an embodiment, the relaxor ferroelectric layer 104 includes a combination of K, Na, Nb and O. In one such embodiment, the relative ratio of the atoms with respect to each other corresponds to that which would be present in a solid solution of $K_xNa_{1-x}NbO_3$ (e.g., a solid solution in relaxor ferroelectric layer 104) —e.g., where x is 0.5.

In another embodiment, relaxor ferroelectric layer 104 includes a combination of an oxide of barium, an oxide of titanium, and an oxide of neodymium, for example BaO—$TiO_2$—$Nd_2O_3$.

In an embodiment, the relaxor ferroelectric layer 104 has a thickness between 5 nm and 50 nm. A thickness between 5 nm and 50 nm enables a sufficiently low leakage current during operation, such as a leakage current less than $10^{-6}$ $A/cm^2$.

The electrodes 102 and 106 each include a metal, metal alloy or a conductive metal oxide. The electrode 102 may have a same or a different material composition from a material of the electrode 106. The electrodes 102 and 106 may each have substantially similar workfunction values. In an embodiment, the electrode 102 includes a metal such as Ru, Al, Cu, W, Pt, Ir, Co, Au, Ti or Ta, or a metal oxide such as $SrRuO_3$, $Ba_{0.5}Sr_{0.5}Ru_{0.3}$, $RuO_x$, $IrO_x$, $TiO_x$ or $TaO_x$. In an embodiment, the electrode 102 includes a metal such as Ru, Al, Cu, W, Pt, Ir, Co, Au, Ti, or Ta, or a metal oxide such as $SrRuO_3$, $Ba_{0.5}Sr_{0.5}RuO_3$, $RuO_x$, $IrO_x$, $TiO_x$, as $TaO_x$.

Depending on the application, electrode 102 may have a thickness that is between 20 nm and 50 nm and electrode 106 may have a thickness that is between 20 nm and 50 nm. The thicknesses of electrode 102 may be substantially the same or different from a thickness of electrode 104.

In other examples, the electrode 102 may include a plurality of layers such as two or three layers forming a stacked electrode 102.

Figure 1B:
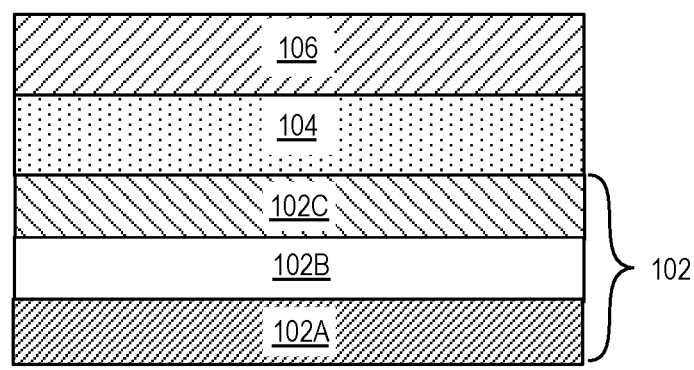
FIG. 1B illustrates a cross-sectional view of a capacitor including a relaxor ferroelectric layer, and an electrode that includes three layers of differing materials, in accordance with an embodiment of the present disclosure.

FIG. 1B illustrates a cross-sectional view of a capacitor device 100B including a relaxor ferroelectric layer 104, and an electrode 102 that includes three layers, in accordance with an embodiment of the present disclosure. In the illustrative embodiment, the electrode 102 includes a first electrode layer 102A, a second electrode layer 102B on the first electrode layer 102A, and a third electrode layer 102C on the electrode layer 102B. In one embodiment, the electrode layer 102A includes tantalum, electrode layer 102B includes ruthenium, and electrode layer 102C includes iridium. In another embodiment, the electrode layer 102A includes tantalum, electrode layer 102B includes iridium, and electrode layer 102C includes ruthenium.

In an embodiment, the electrode layer 102A has a thickness between 1 nm-10 nm, the electrode layer 102B has a thickness between 5 nm-20 nm and the electrode layer 102C has a thickness between 5 nm-20 nm. In an embodiment, the combined thickness of the electrode layers 102A, 102B and 102C is between 20 nm and 50 nm.

In other embodiments, a MIM capacitor may include more than one ferroelectric layer.

Figure 1C:
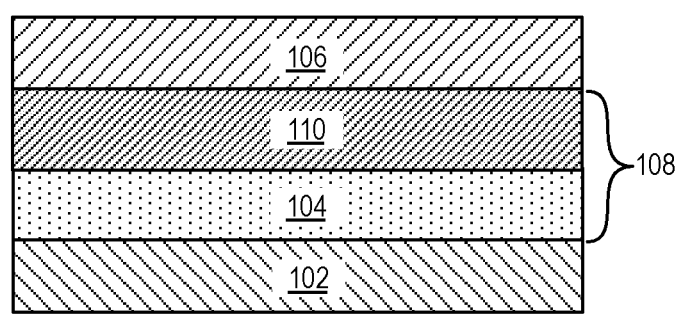
FIG. 1C illustrates a cross-sectional view of a capacitor including a first relaxor ferroelectric layer and a second ferroelectric layer, in accordance with an embodiment of the present disclosure.
Figure 1C:
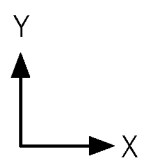

FIG. 1C illustrates a cross-sectional view of a capacitor 100C including ferroelectric stack 108 between the electrodes 102 and 106. As shown the ferroelectric stack 108 is a bilayer that includes a ferroelectric layer 104 and a ferroelectric layer 110 on the ferroelectric layer 104. The ferroelectric layer 104 is directly adjacent to and coupled with the electrode 102 and the ferroelectric layer 110 is directly adjacent to and between the ferroelectric layer 104 and the electrode 106. In an embodiment, ferroelectric layer 104 includes a relaxor material and is referred to as a relaxor ferroelectric layer 104.

The ferroelectric layer 110 may include a relaxor or a non-relaxor material depending on the application. In an embodiment, the ferroelectric layer 110 includes a relaxor material. Examples of relaxor material include oxygen and two or more of lead, barium, manganese, zirconium, titanium, iron, bismuth, neodymium, strontium, potassium or niobium. When the ferroelectric layer 110 includes a relaxor material, the material of the relaxor-ferroelectric layer 110 is different from a material of the relaxor ferroelectric layer 104. When the ferroelectric layer 110 includes a relaxor material, the ferroelectric stack 108 is a relaxor ferroelectric stack 108.

The individual thicknesses of the relaxor ferroelectric layer 104 and the relaxor ferroelectric layer 110 may range between 2.5 nm and 47.5 nm. In an embodiment, relaxor ferroelectric layer 104 and relaxor ferroelectric layer 110 may each range between 2.5 nm and 47.5 nm and the thickness of the relaxor ferroelectric stack 108 is between 5 nm and 50 nm.

In other embodiments, the ferroelectric layer 110 includes a non-relaxor material such as a compound of hafnium oxygen that is and doped with one or more of Zr, Al, Si, N, Y or La. In embodiments where the ferroelectric layer 110 does not include a relaxor material, the ferroelectric layer 110 has a thickness between 1 nm and 5 nm, and the relaxor ferroelectric layer 104 has a thickness between 2 nm and 10 nm. In some such embodiments, the combined sum of the thickness of the ferroelectric layer 110 and a relaxor ferroelectric layer 104 is between 5 nm and 50 nm.

Depending on the choice of materials, the ratio of the dielectric constant between the relaxor ferroelectric layer 104 and the ferroelectric layer 110 is between 2 and 110. In examples where the ferroelectric layer 110 includes a compound of hafnium oxygen that is doped with one or more of Zr, Al, Si, N, Y or La, the ferroelectric layer 110 has a dielectric constant that is between 20 and 50 and the relaxor ferroelectric layer 104 has a dielectric constant between 100-2200.

In an embodiment, when a relaxor ferroelectric stack 108 includes a bilayer stack such as described above, the bilayer stack may be capped by a third ferroelectric material to introduce symmetry in the MIM capacitor.

Figure 1D:
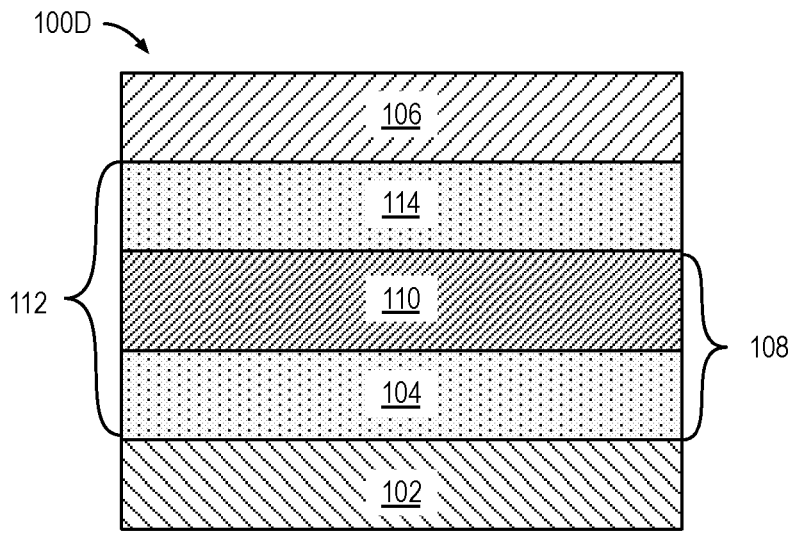
FIG. 1D illustrates a cross-sectional view of a capacitor including a multilayer stack having a bilayer stack, where the bilayer stack includes a first relaxor ferroelectric layer and a ferroelectric layer, capped by a second relaxor ferroelectric layer, in accordance with an embodiment of the present disclosure.

FIG. 1D illustrates a cross-sectional view of a capacitor device 100D includes a multilayer ferroelectric stack 112, where the multilayer ferroelectric stack 112 further includes ferroelectric stack 108 capped by a ferroelectric layer 114, in accordance with an embodiment of the present disclosure.

In an embodiment, the ferroelectric stack 108 includes one of a first relaxor ferroelectric layer 104 or a first non-relaxor ferroelectric layer 104 including oxygen and two or more of lead, barium, manganese, zirconium, titanium, iron, bismuth, neodymium, potassium or niobium. In some such embodiments, the ferroelectric stack 108 further includes one of a second relaxor ferroelectric layer 110 or second non-relaxor ferroelectric layer 110 on the one of the first relaxor ferroelectric layer 104 or the first non-relaxor ferroelectric layer 104. In exemplary embodiments, the multilayer ferroelectric stack 112 includes at least one layer having a relaxor ferroelectric material but is symmetric in material composition about the ferroelectric layer 110. In some such embodiments, the ferroelectric layer 114 can include either a relaxor or a non-relaxor material. In one configuration, the multilayer ferroelectric stack 112 includes a relaxor ferroelectric layer 104, a relaxor ferroelectric layer 110 and a relaxor ferroelectric layer 114. In a second embodiment, the multilayer ferroelectric stack 112 includes a relaxor ferroelectric layer 104, a non-relaxor ferroelectric layer 110 and a relaxor ferroelectric layer 114. In a third embodiment, the multilayer ferroelectric stack 112 includes a non-relaxor ferroelectric layer 104, a relaxor ferroelectric layer 110 and a non-relaxor ferroelectric layer 114.

In some embodiments, when the ferroelectric layer 114 includes a relaxor material, the material of the relaxor ferroelectric layer 114 is the same as the material of the relaxor ferroelectric layer 104 to introduce symmetry in the capacitor device 100D. Examples of relaxor material include oxygen and two or more of lead, barium, manganese, zirconium, titanium, iron, bismuth, neodymium, strontium or niobium. In other embodiments, when the ferroelectric layer 114 includes a relaxor material, the material of the relaxor-ferroelectric layer 114 is different from the material of the relaxor ferroelectric layer 104. From an operational perspective, the behavior of the ferroelectric stack 108 including a relaxor ferroelectric material and non-relaxor ferroelectric material is dominated by properties of the relaxor ferroelectric material.

In some embodiments, the multilayer ferroelectric stack 112 is between 5 nm and 50 nm thick. In exemplary embodiments, the layers 104, 110 and 114 having a relaxor material are thicker than the layers 104, 110 and 114 that have a non-relaxor material.

In yet another embodiment, the multilayer stack 112 is a super lattice structure including a plurality of ferroelectric stacks 108.

Figure 1E:
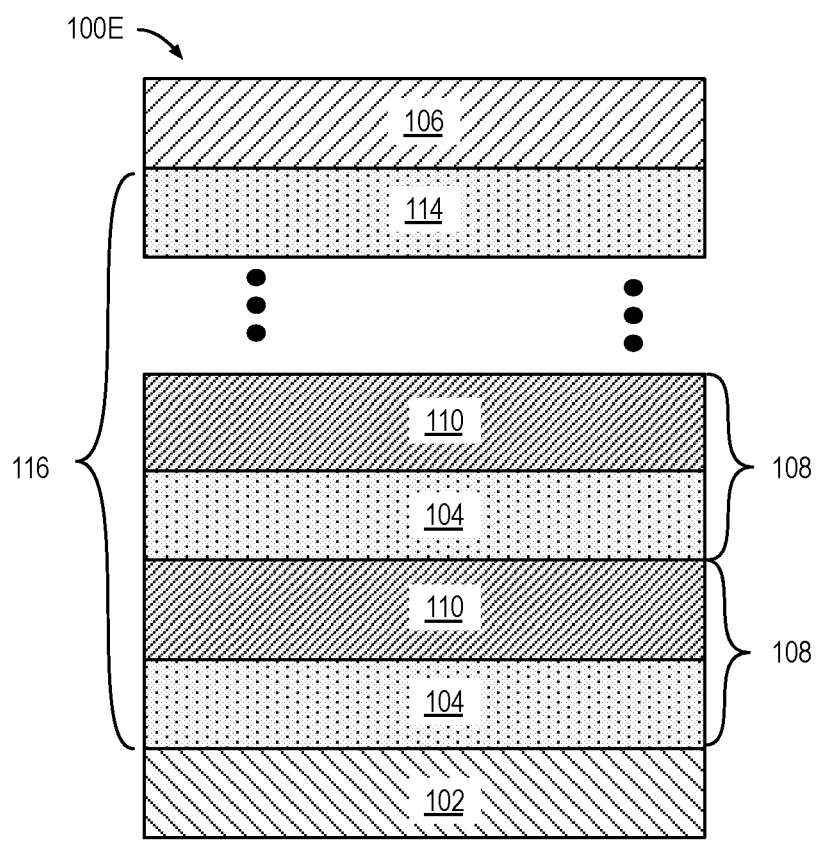
FIG. 1E illustrates a cross-sectional view of a capacitor including a multilayer stack having a plurality of bilayer stacks, where each of the bilayer stack includes a first relaxor ferroelectric layer and a ferroelectric layer, and where the plurality of bilayer stacks is capped by a second relaxor ferroelectric layer, in accordance with an embodiment of the present disclosure.

FIG. 1E is an illustration of a cross-sectional view of a capacitor device 100E, where the multilayer stack 116 is a super-latticed structure, in accordance with an embodiment of the present disclosure. As shown, the multilayer stack 112 includes a plurality of ferroelectric stack 108, capped by a ferroelectric layer 114. The ferroelectric layer 114 may include a relaxor material described in association with FIG. 1D. Referring again to FIG. 1E, in some embodiments, the material composition of each ferroelectric stack 108 may be substantially identical, where each relaxor ferroelectric layer 104 is identical to every other relaxor ferroelectric layer 104 in the multilayer stack 112, and where each ferroelectric layer 110 is identical to every other ferroelectric layer 110 in the multilayer stack 112. In further such embodiment, each ferroelectric layer 110 is a relaxor ferroelectric layer 110 having a distinctly different material composition from a material composition of the relaxor ferroelectric layer 104.

In other embodiments, relaxor ferroelectric layer 104 in one ferroelectric stack 108 is different from the relaxor ferroelectric layer 104 in each of the remaining ferroelectric stacks 108. In some embodiments, ferroelectric layer 110 in one ferroelectric stack 108 is different from the ferroelectric layer 110 in each of the remaining ferroelectric stacks 108.

In some examples, the ferroelectric layer 114 includes a material that is the same or substantially the same as the material of the relaxor ferroelectric layer 104 directly adjacent to the electrode 102. In other embodiments, the ferroelectric layer 114 includes a material that is the same or substantially the same as the material of the relaxor ferroelectric layer 104 in one or more of the ferroelectric stack 108.

In other examples, each ferroelectric stack 108 in the super latticed-multilayer stack 116, includes a non relaxor ferroelectric layer 104 and a relaxor ferroelectric layer 110 on the non relaxor ferroelectric layer 104. In some such embodiments, the ferroelectric layer 114 is a non relaxor ferroelectric layer 114 to provide symmetry in the capacitor device 100E.

In an embodiment, the multilayer stack 112 includes anywhere from 1-10 ferroelectric stack(s) 108. In an embodiment, the material layer stack 112 has a thickness between 5 nm and 50 nm, where the ferroelectric layer 114 has a thickness of at least 1 nm. In one embodiment, where the number of ferroelectric stacks 108 is greater than one, the thickness of each ferroelectric stack 108 is substantially the same, but the total combined thickness of each of the ferroelectric stack 108 and the ferroelectric layer 114 is between 5 nm and 50 nm. In some such embodiments, the combined thickness of the ferroelectric stacks 108 in the multilayer stack 112 is between 4 nm and 49 nm.

In some examples where the number of ferroelectric stacks 108 is greater than one, each ferroelectric stack 108 may have a different thickness that depends on the material composition of each constituent layer 104 and 110. In some such embodiment, the total combined thickness of each of the ferroelectric stack 108 and the ferroelectric layer 114 is between 5 nm and 50 nm.

Figure 2A:
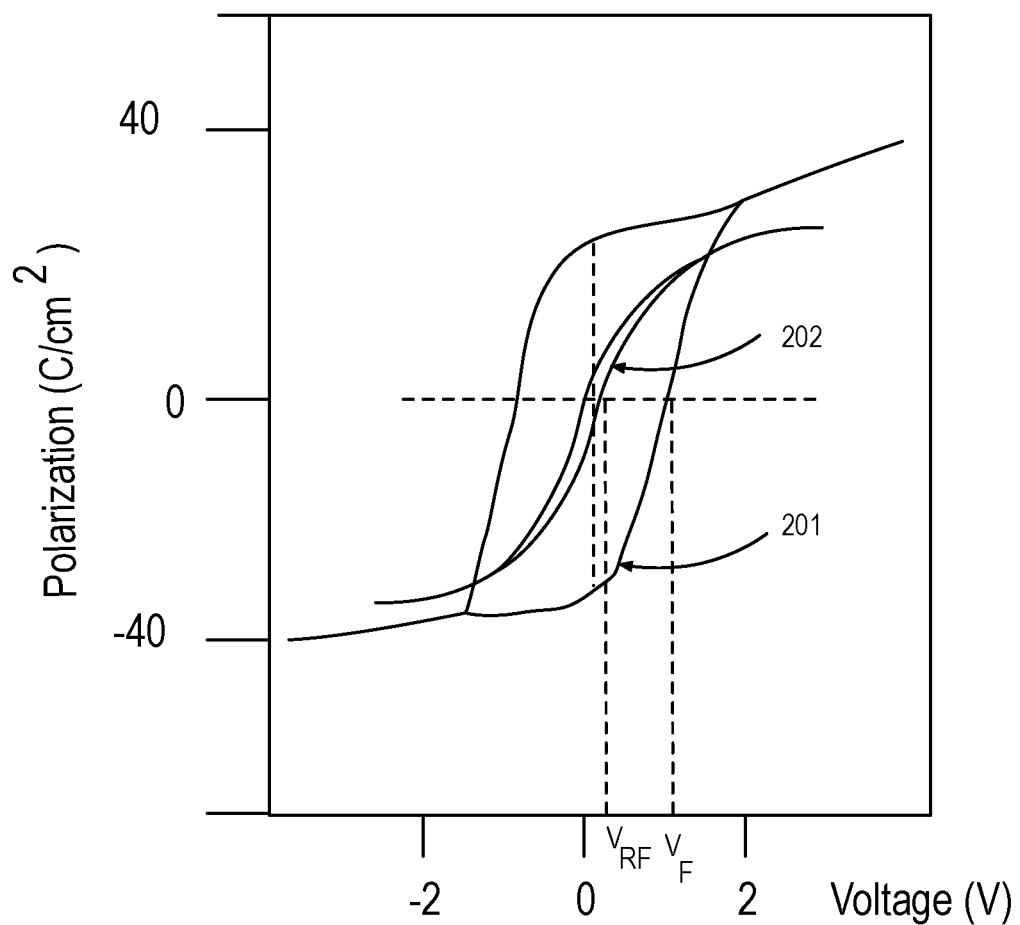
FIG. 2A illustrates a plot of Electric Polarization versus Voltage characteristics of a relaxor ferroelectric material and of a non-relaxor ferroelectric material.
Figure 2B:
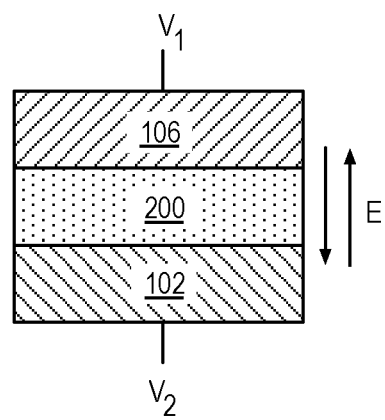
FIG. 2B illustrates a MIM capacitor test structure connected to a pair of voltage terminals.

FIG. 2A illustrates a plot of Electric Polarization versus Voltage characteristic (hysteretic effect) of a relaxor ferroelectric material and a ferroelectric material. To determine the electrical polarization behavior of ferroelectric layer 104, voltage is applied between a pair of electrodes 102 and 106 directly adjacent to opposite sides of a ferroelectric layer 200 in a stack such as is illustrated in FIG. 2B. A time varying voltage with varying voltage polarity generates an oscillating electric field between the electrodes 102 and 106 as shown. In one embodiment, ferroelectric layer 200 includes a relaxor ferroelectric material and in a second embodiment, the ferroelectric layer 200 includes a non-relaxor material. The relaxor and non-relaxor materials in ferroelectric layer 200 are substantially the same as the material of the relaxor and non-relaxor materials in ferroelectric layer 110 described above in association with FIG. 1B. Referring again to FIG. 2A, hysteresis loop 201 is indicative of a P-V behavior for a non relaxor material. The degree of polarization in the non-relaxor material determines an electric field required to switch the direction of polarization in the non-relaxor material. In an embodiment, the polarization changes direction (positive to negative value or vice versa) at an electric field corresponding to a voltage $V_F$ in the ferroelectric layer 200 having a non-relaxor material. The electric field corresponding to the voltage, $V_F$ is a "coercive field" for the non relaxor material.

Hysteresis loop 202 is indicative of a P-E behavior for a non relaxor material. The polarization changes direction (positive to negative value or vice versa) at an electric field corresponding to a voltage $V_{RF}$ in a relaxor material. The electric field corresponding to the voltage, $V_{RF}$ is the "coercive field" for the relaxor material. In contrast, to the P-V behavior for the non-relaxor material, the P-V behavior for ferroelectric layer 200 having a relaxor material has a substantially smaller coercive field compared to the coercive field for the non-relaxor material. $V_{RF}$ is substantially smaller than $V_F$ because smaller domains in a relaxor material respond rapidly to a weaker electric field compared to larger domains in a non relaxor material. Moreover, ferroelectric layer 200 having relaxor materials substantially suppress the hysteretic effect and thus are more suitable for decoupling applications.

While planar MIM capacitors have been described thus far, in other embodiments, MIM capacitor devices have a non-planar geometry. One example of a non-planar geometry is a trench capacitor where the trench may exist at a variety of levels within the integrated circuit and may be laterally adjacent to both conductive and non-conductive material.

Figure 3:
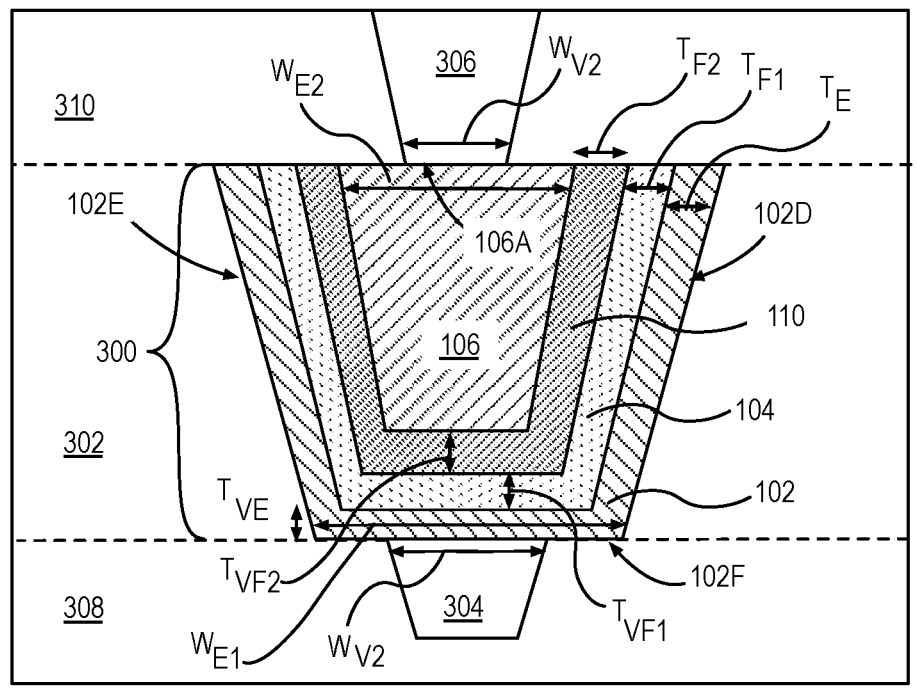
FIG. 3 illustrates a cross-sectional view of a trench capacitor including a relaxor ferroelectric layer and a ferroelectric layer, in accordance with an embodiment of the present disclosure.

FIG. 3 illustrates a cross-sectional view of a trench capacitor 300. In the illustrative embodiment, the trench capacitor 300 includes a relaxor ferroelectric layer 104 and a ferroelectric layer 110. The trench capacitor 300 is adjacent to a dielectric 302 and coupled to a via electrode 304 and a via electrode 306.

In the illustrative embodiment, the electrode 102 has portions that are directly adjacent to the dielectric 302. As shown, the electrode 102 has sidewalls 102D and 102E that are directly adjacent to the dielectric 302. The sidewalls 102D and 102E may be substantially vertical or tapered. In the illustrative embodiment, sidewalls 102D and 102E are tapered. In other embodiments, sidewalls 102D and 102E are substantially vertical. As shown, a portion of electrode surface 102F is directly on via electrode 304 and a portion is on a dielectric 308 adjacent to the via electrode 304. In an embodiment, the lower most portion of electrode 102 has a width, $W_{E1}$, that is wider than a maximum lateral width, $W_{V2}$, of via electrode 304. In other embodiments, $W_{E1}$ is less than $W_{V2}$. In some embodiments, the via electrode 304 is a line extending along the X-axis in the figure. In some such embodiments, the electrode 102 is not adjacent to the dielectric 308. Due to the geometry of the capacitor 300, different portions of the electrode 102 may have thicknesses that are either substantially the same or vary from each other. In an embodiment, the electrode 102 has a lateral thickness, $T_{F1}$, that is between 5 nm and 50 nm and a vertical thickness $T_{VE}$ between 5 nm and 50 nm.

The relaxor ferroelectric layer 104 is directly adjacent to electrode 102 as shown, where the relaxor ferroelectric layer 104 is substantially conformal to the shape of the electrode 102. As shown, the relaxor ferroelectric layer 104 has a lateral thickness, $T_{F1}$, that is between 5 nm and 15 nm and a vertical thickness $T_{VF1}$ that is between 5 nm and 15 nm. In some embodiments, $T_{F1}$, is substantially the same as $T_{VF1}$. In other embodiments, $T_{F1}$ is different from $T_{FV1}$ by up to 15%.

As shown the ferroelectric layer 110 is directly between the electrode 106 and the relaxor ferroelectric layer 104. In some embodiments, the ferroelectric layer 110 includes a relaxor ferroelectric material and in other embodiments, ferroelectric layer 110 includes a non-relaxor ferroelectric material, depending on the application. As shown, the ferroelectric layer 110 has a lateral thickness, $T_{F2}$, that is between 5 nm and 50 nm and a vertical thickness $T_{VF2}$ that is between 5 nm and 50 nm. In some embodiments, $T_{F2}$, is substantially the same as $T_{VF2}$. In other embodiments, $T_{F2}$ is different from $T_{FV2}$ by up to 15%. The variations in lateral and vertical thicknesses of the electrode 102, relaxor ferroelectric layer 104 and ferroelectric layer 110 may be attributed to processed utilized to fabricate the capacitor 300.

In the illustrative embodiment, the electrode 106 has a shape that is influenced by the shapes of each of the electrode 102, of the relaxor ferroelectric layer 104 and of the ferroelectric layer 110. As shown the electrode 106 has a trapezoidal shape. An upper portion of electrode 106 has a lateral width, $W_{E2}$. As shown $W_{E2}$, is greater than a maximum lateral width, $W_{V2}$ of a lowermost portion of the via electrode 306 that is directly in contact with the electrode surface 106A. $W_{E2}$ is greater than $W_{V2}$ to prevent electrical shorting between via electrode 306 and electrode 102.

In an embodiment, each dielectric 302, dielectric 308 and dielectric 310 (adjacent to the via electrode 306) includes a same material. In an embodiment, each dielectric 302, dielectric 308 and dielectric 310 includes a material such as but not limited to silicon dioxide, silicon nitride, silicon carbide, or carbon doped silicon oxide. In one embodiment, each of the dielectric 302, dielectric 308 and dielectric 310 includes a material that is different from one another. In another embodiment, any two dielectric 302, dielectric 308 or dielectric 310 includes a same or substantially the same material.

In other examples, the capacitors 100A, 100C, 100D and 100E may each have a trench capacitor geometry which is the same or substantially the same as a geometry of the trench capacitor 300.

In other examples the dielectric 302 may be replaced by a conductive material utilized to form an interconnect. In such examples, two or more capacitors that are adjacent but distant from each other may be electrically coupled through the conductive material.

Figure 4A:
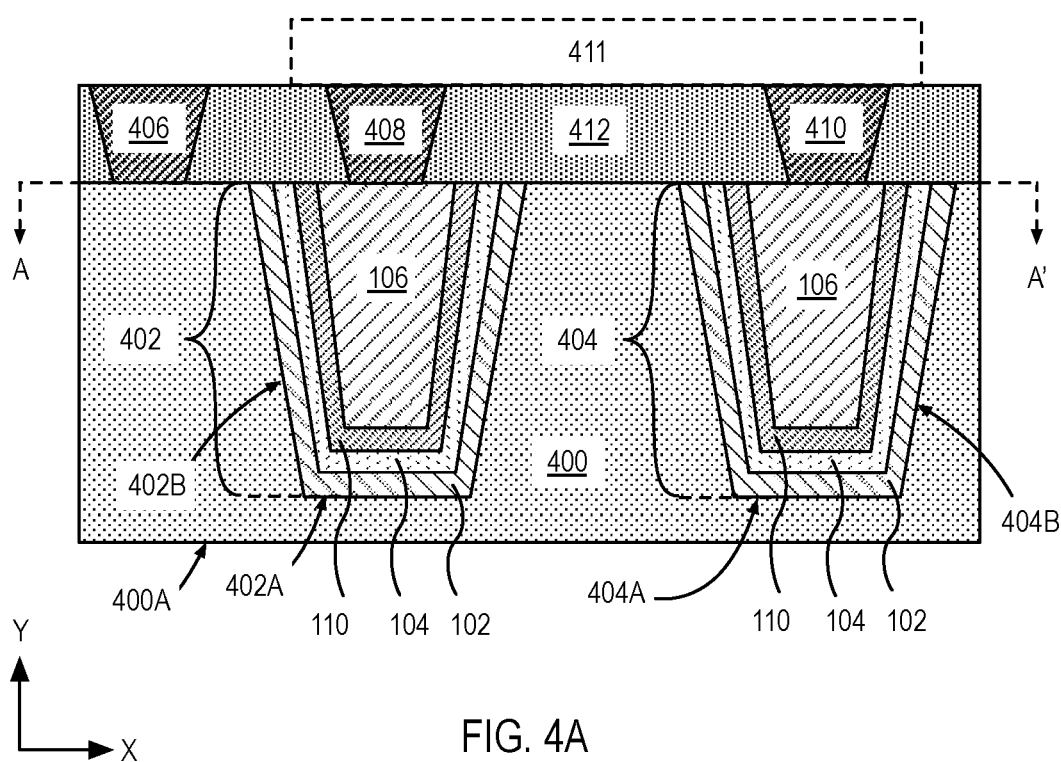
FIG. 4A illustrates a cross-sectional view of a pair of trench capacitors, where each capacitor includes a relaxor ferroelectric layer and a ferroelectric layer adjacent to the relaxor ferroelectric layer, in accordance with an embodiment of the present disclosure.

FIG. 4A illustrates a cross-sectional view of a conductive layer 400 adjacent to a pair of trench capacitors such as trench capacitor 402 and trench capacitor 404. Depending on applications, the conductive layer may include tungsten, nitrides of tantalum or titanium and ruthenium.

In some embodiments, such as in the embodiment illustrated, the conductive layer 400 laterally surrounds trench capacitor 402 and trench capacitor 404. As shown, trench capacitor 402 and trench capacitor 404 are embedded in the conductive layer 400, where the conductive layer 400 is directly in contact with lower most trench capacitor surfaces 402A and 404A. The conductive layer 400 may be electrically coupled from above or from below surface 400A. In the illustrative embodiment, the conductive layer 400 is electrically coupled by a conductive via 406 that is above the conductive layer 400.

In the illustrative embodiment, the electrode 102 of trench capacitor 402 is electrically coupled with the electrode 102 of trench capacitor 404 through the conductive layer 400 when the conductive layer 400 is energized.

In an embodiment, the trench capacitor 402 is coupled to a conductive via 408 and trench capacitor 404 is coupled to a via 410, as shown. The conductive via 408 is only in contact with an upper portion of electrode 106 of trench capacitor 402, and conductive via 410 is only in contact with an upper portion of electrode 106 of trench capacitor 404. In such a configuration, each trench capacitor 402 and 404 may be charged or discharged separately during operation.

In other embodiments, a conductive bridge may exist that provides electrical coupling between electrode 106 in each of the trench capacitors 402 and 404. Dashed box 411 indicates an outline of a conductive bridge directly on and coupled with each of the conductive vias 408 and 410.

In other examples, conductive layer 400 may be present only directly between trench capacitor 402 and trench capacitor 404 and directly below trench capacitor surfaces 402A and 404A. In some such embodiments, the conductive layer 400 does not extend laterally beyond the trench capacitor surfaces 402A and 404A. In further some such embodiments, a dielectric is present adjacent to trench capacitor sidewalls 402B and 404B, and the conductive via 406 is laterally between conductive via 408 and conductive via 410. In such embodiments, a conductive bridge connecting conductive via 408 and conductive via 410 can be present on a plane behind the plane of cross-sectional illustration of FIG. 4A.

In the configuration illustrated, each trench capacitor 402 and 404 is substantially identical in size and in composition. In an embodiment, trench capacitor 402 and trench capacitor 404 include one or more materials of the trench capacitor 300, described in association with FIG. 3. Referring again to FIG. 4A, in other embodiments, materials and associated lateral and vertical thicknesses of each of the electrode 102, relaxor ferroelectric layer 104, ferroelectric layer 110 and electrode 106 in trench capacitor 402 may correspondingly differ from the materials, and associated lateral and vertical thicknesses of the electrode 102, relaxor ferroelectric layer 104, ferroelectric layer 110 and electrode 106 in trench capacitor 404.

In other embodiments, the capacitors 402 and 404 have multiple layers of relaxor and non relaxor materials, and electrode materials such as is described above in association with FIGS. 1B, 1D and 1E.

Figure 4B:
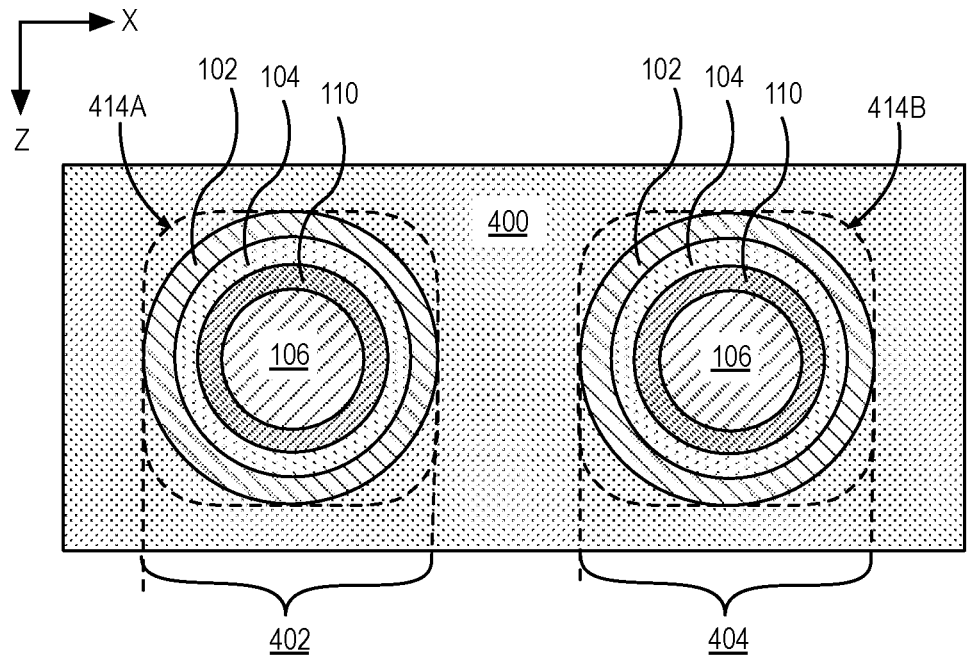
FIG. 4B illustrates a plan view of a trench capacitors 402 and 404, along the line A-A' in the FIG. 4A.

FIG. 4B illustrates a plan view of a trench capacitors 402 and 404, along the line A-A' in the FIG. 4A. Referring again to FIG. 4B, each of the trench capacitors 402 and 404 have a circular plan view shape as shown. In an embodiment, the electrode 102, relaxor ferroelectric layer 104, ferroelectric layer 110 are concentrically arranged. In another embodiment, each of the trench capacitors 402 and 404 have a substantially rectangular plan view shape as indicated by dashed lines 414A and 414B.

Figure 4C:
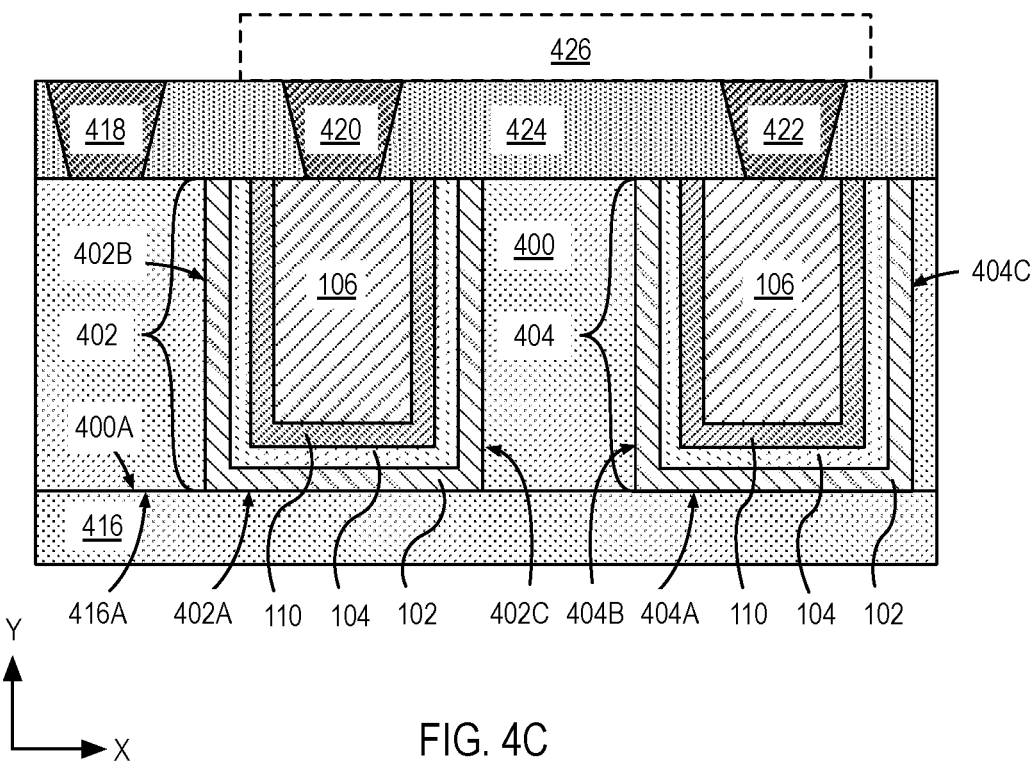
FIG. 4C illustrates a cross-sectional view of a pair of trench capacitors, where each capacitor includes a relaxor ferroelectric layer and a ferroelectric layer adjacent to the relaxor ferroelectric layer, in accordance with an embodiment of the present disclosure.

FIG. 4C illustrates a cross-sectional view of a pair of trench capacitors, such as trench capacitor 402 and trench capacitor 404 that are separated by a conductive layer 400 including copper, in accordance with an embodiment of the present disclosure. In applications where the conductive layer 400 includes copper, the shapes of the two or more trench capacitors may be substantially different from trapezoidal shape of the trench capacitors 402 and 404 illustrated in FIG. 4A. Referring again to FIG. 4C, such differences in shapes of the trench capacitors 402 and 404 may be attributed to processing utilized to implement copper in the conductive layer 400. In the illustrative embodiment, trench capacitor sidewalls 402B and 402C, and trench capacitor sidewalls 404B and 404C are substantially vertical with respect to conductive layer surface 400A.

Depending on embodiments, the conductive layer 400 may be above a layer 416 that is either a conductor or an insulator. In an embodiment, layer 416 is a conductor and includes copper or any other conductive material such as, but not limited to, ruthenium, tungsten, titanium, tantalum, or nitrides of tungsten, titanium, or tantalum. In other embodiments where layer 416 includes a conductive material other than copper and layer 400 includes copper, surface 400A may extend below lower most trench capacitor surfaces 402A and 404A, as will be discussed further below. In other embodiments, layer 416 is an insulator and includes a includes a material that is the same or substantially the same as the material of the dielectric 302 described in association with FIG. 3.

Referring again to FIG. 4C, in the illustrative embodiment, the conductive layer 400 is electrically coupled by a via 418 that is on the conductive layer 400. As shown, the conductive via 420 is only in contact with an upper portion of electrode 106 of trench capacitor 402, and conductive via 422 is only in contact with an upper portion of electrode 106 of trench capacitor 404. In such a configuration, each trench capacitor 402 and 404 may be charged or discharged separately during operation.

In other embodiments, a conductive bridge may exist that provides electrical coupling between electrode 106 of each trench capacitor 402 and trench capacitor 404. Dashed box 426 indicates an outline of a conductive bridge directly on and coupled with each of the conductive vias 420 and 422. The conductive bridge may be on a plane behind a plane of the cross-sectional illustration of FIG. 4C.

In other embodiments, the capacitors 402 and 404 have multiple layers of relaxor and non relaxor materials, and electrode materials such as is described above in association with FIGS. 1B, 1D and 1E.

Figure 5:
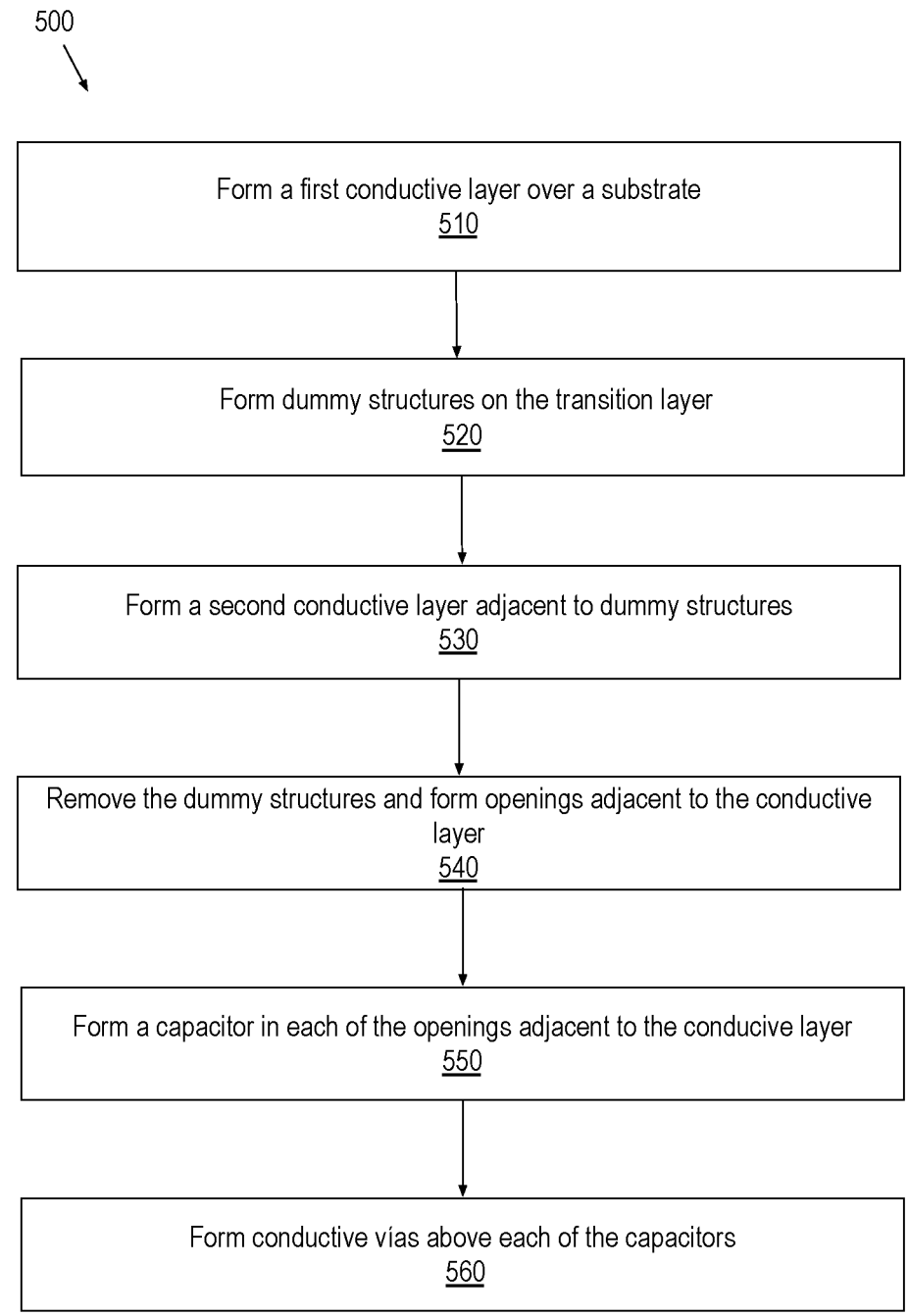
FIG. 5 illustrates a flow diagram of a method to fabricate a capacitor.

FIG. 5 illustrates a flow diagram of a method to fabricate a capacitor 500. The method 500 begins at operation 510 by forming a first conductive interconnect layer above a substrate. The method continues at operation 520 with the formation of dummy structures on the transition layer. At operation 530, the method 500 involves formation of a second conductive layer adjacent to the dummy structures. At operation 540, the method 500 involves removing the dummy structures to create openings. The method continues at operation 550 with formation of a capacitor in each of the opening. The method concludes at operation 560 with the formation of a dielectric above the capacitors and patterning the dielectric to form openings and formation of conductive vias in each of the openings.

FIG. 6A illustrates a substrate 600 and a first transition layer 602 formed above the substrate 600. In an embodiment, the transition layer 602 includes a material that is the same or substantially the same as the material of the layer 416 described above. In one embodiment, the transition layer 602 includes copper is deposited by an electroplating method on the substrate 600. A layer of adhesion material such as tantalum or ruthenium may be deposited on the substrate 600 prior to copper deposition.

In anther embodiment, the transition layer 602 includes NdScO and provides a suitable surface for nucleation of an electrode layer to be deposited in a further operation.

In an embodiment, the substrate 600 includes a suitable semiconductor material such as but not limited to, single crystal silicon, polycrystalline silicon and silicon on insulator (SOI). In another embodiment, substrate 600 includes other semiconductor materials such as germanium, silicon germanium or a suitable group III-N or a group III-V compound. In anther embodiment, the substrate 600 includes $NdScO_3$. Logic devices such as MOSFET transistors and access transistors and may be formed on the substrate 600. In some embodiments, an integrated circuit including transistors is formed between the transition layer 602 and the substrate 600.

FIG. 6B illustrates the structure of FIG. 6A following the formation of dummy structures 604 and 606 on the transition layer 602, in accordance with an embodiment of the present disclosure. In an embodiment, a dielectric material is blanket deposited on the transition layer 602. The dielectric material may be formed by forming a mask on the dielectric material by a lithographic technique and then etching the dielectric material to form dummy structures 604 and 606. In some embodiments, the choice of dielectric materials may be limited to those that do not require any corrosive gases such as chlorine or bromine to be patterned. In some such embodiments, the dielectric material may include a material that is the same or substantially the same as dielectric 302 discussed in association with FIG. 3. Referring again to FIG. 6B, in examples, where the transition layer 602 does not include copper, the dummy structures 604 and 606 may each include a material such as poly crystalline silicon that can be implemented for ease of patterning. In one such embodiment, an uppermost surface 602A of the transition layer 602 may be recessed below lowermost dummy structure surfaces 604A and 606A during patterning to form the dummy structures. It is to be appreciated that sidewall profiles of the dummy structures 604 and 606 may be substantially vertical with respect to the uppermost surface 602A. In other embodiments, the sidewall profiles of the dummy structures 604 and 606 may be tapered with respect to the uppermost surface 602A during the etch process. In some such embodiments, tapering causes a base of the dummy structure lower surfaces 604A and 606A to be greater than dummy structure upper surfaces 604B and 606B, respectively.

FIG. 6C illustrates the structure of FIG. 6B following the formation of a conductive interconnect layer 608 on the transition layer 602 adjacent to the dummy structures 604 and 608. In an embodiment, the conductive interconnect layer 608 includes copper or any other conductive material such as ruthenium, tungsten, titanium or tantalum, or nitrides of tungsten, titanium, or tantalum. The conductive interconnect layer 608 may be blanket deposited on the surface of the transition layer 602, and on the dummy structures 604 and 606. After deposition of the conductive interconnect layer 608 a planarization process is carried out remove excess conductive interconnect layer 608 from the above the dummy structures 604 and 606. The planarization exposes upper surfaces 604B and 606B. In an embodiment, the planarization process includes a chemical mechanical polish (CMP) process. In an embodiment, where the conductive interconnect layer 608 includes copper, a liner layer including tantalum, ruthenium or copper may be deposited prior to depositing a copper-conductive interconnect layer 608. In one such embodiment, the liner layer is deposited on the transition layer 602 and on sidewalls of dummy structures 604 and 606. The liner layer is also deposited on surfaces 604B and 606B but removed during the planarization process.

Figure 6D:
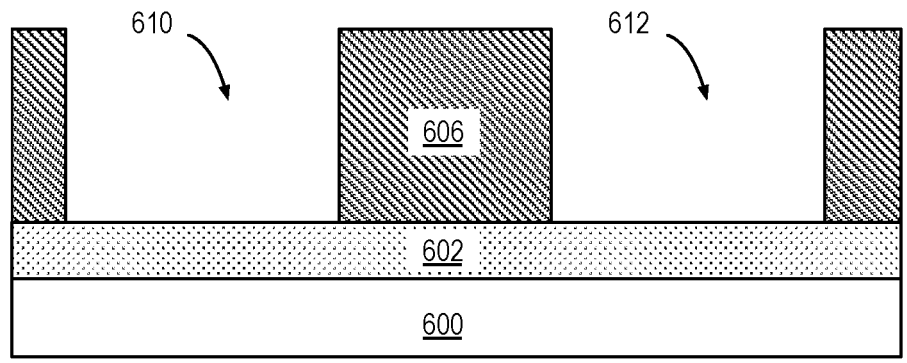
FIG. 6D illustrates the structure of FIG. 6C following the removal of the dummy structures to form a first opening and a second opening in the second conductive interconnect layer.

FIG. 6D illustrates the structure of FIG. 6C following the removal of the dummy structures 604 and 606 to form a first opening 610 and a second opening 612. In an embodiment, a wet chemical process or a plasma etch process may be utilized to remove the material of the dummy structures 604 and 606 selectively without damaging the conductive interconnect layer 608.

Figure 6E:
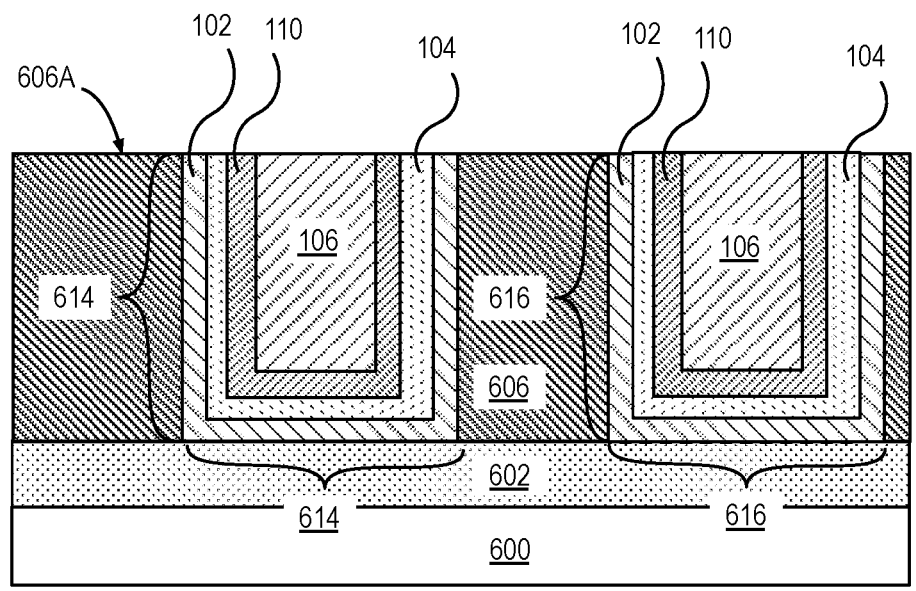
FIG. 6E illustrates the structure of FIG. 6D following the formation of a first trench capacitor in the first opening and the formation of a second trench capacitor in the second opening, in accordance with an embodiment of the present disclosure.

FIG. 6E illustrates the structure of FIG. 6D following the formation of a trench capacitor 614 in the opening 610 and the formation of a trench capacitor 616 in the opening 612, in accordance with an embodiment of the present disclosure. In an embodiment, materials of the electrode 102, relaxor ferroelectric layer 104, ferroelectric layer 110 and electrode 106 are sequentially deposited into the openings 610 and 612 and then subsequently planarized. In an exemplary embodiment, the relaxor ferroelectric layer 110 includes a relaxor ferroelectric material. The relaxor ferroelectric layer 104 and ferroelectric layer 110 can be deposited through physical vapor deposition (PVD) process, molecular beam epitaxy (MBE), or an atomic layer deposition (ALD) process at processing temperature below 600 degrees Celsius. In other embodiments, a super-latticed structure can be achieved by a laminated or a co-flow deposition process. In one embodiment, the relaxor ferroelectric layer 104 includes a combination of lead, niobium, oxygen, and one of magnesium or zirconium.

The deposition process includes forming a material for the electrode 102 on the transition layer 602 and on sidewalls and uppermost surface 606A of the conductive interconnect layer 606. In an embodiment, when the material for electrode 102 includes Ba, Sr, Ru and O, an epitaxial transition layer 602 including NdScO can provides a suitable surface for nucleation of the material for electrode 102.

The electrode 102 material may be deposited by a chemical vapor deposition (CVD), or a plasma enhanced chemical vapor deposition (PECVD), physical vapor deposition (PVD) process, molecular beam epitaxy (MBE), or an atomic layer deposition (ALD) process. The process continues with formation of the material of the relaxor ferroelectric layer 104 on the material of the electrode 102, and formation of the material of the relaxor ferroelectric layer 110 on the relaxor ferroelectric layer 104. The deposition process concludes with the formation of a material for the electrode 106 on the material of the relaxor ferroelectric layer 110. The electrode 102 material may be deposited by a chemical vapor deposition (CVD), or a plasma enhanced chemical vapor deposition (PECVD), physical vapor deposition (PVD) process, molecular beam epitaxy (MBE), or an atomic layer deposition (ALD) process. In an embodiment, the planarization process includes a CMP process and removes the materials deposited above the uppermost surface 606A.

Figure 6F:
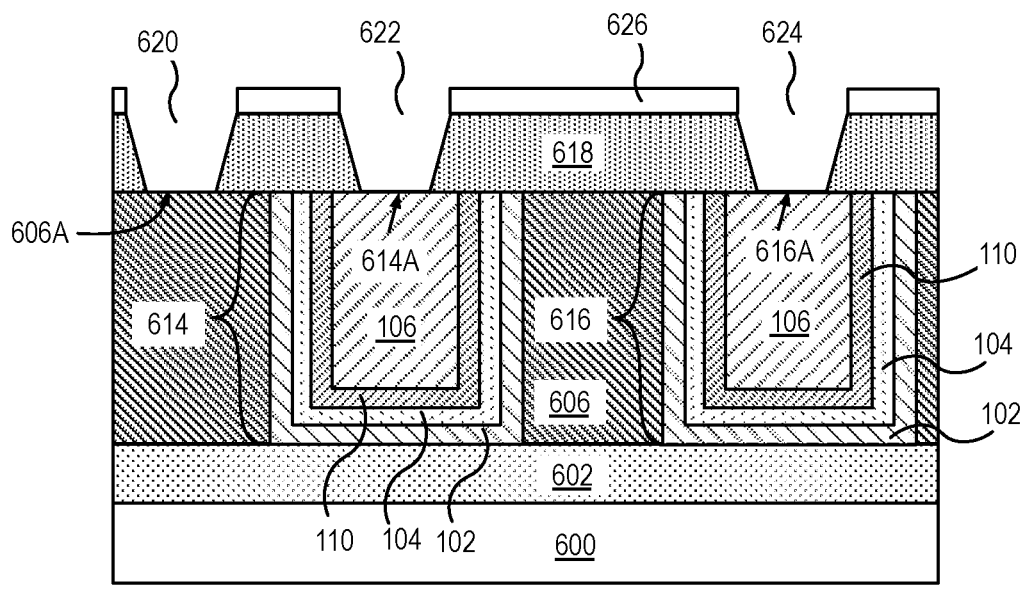
FIG. 6F illustrates the structure of FIG. 6E following the formation of a dielectric layer on the second conductive interconnect layer and on the first and on the second trench capacitors, followed by the formation of a plurality of openings in the dielectric material.

FIG. 6F illustrates the structure of FIG. 6E following the formation of a dielectric layer 618 on the conductive interconnect layer surface 606A and on trench capacitor uppermost surfaces 614A and 616A. In an embodiment, the dielectric 618 includes any material that has sufficient dielectric strength to provide electrical isolation, such as, but not limited to silicon dioxide, silicon nitride, silicon carbide, or carbon doped silicon oxide.

A mask 626 may be formed on the dielectric. The mask may be formed by a lithographic process. The mask defines locations of openings to be formed after patterning the dielectric 618. In an embodiment, a plasma etch process is utilized to form openings 620, 622, and 624 in the dielectric material 618. In other embodiments, opening 620 may not be formed adjacent to the opening 622. The mask 626 is removed after the formation of the openings 620, 622, and 624.

Figure 6G:
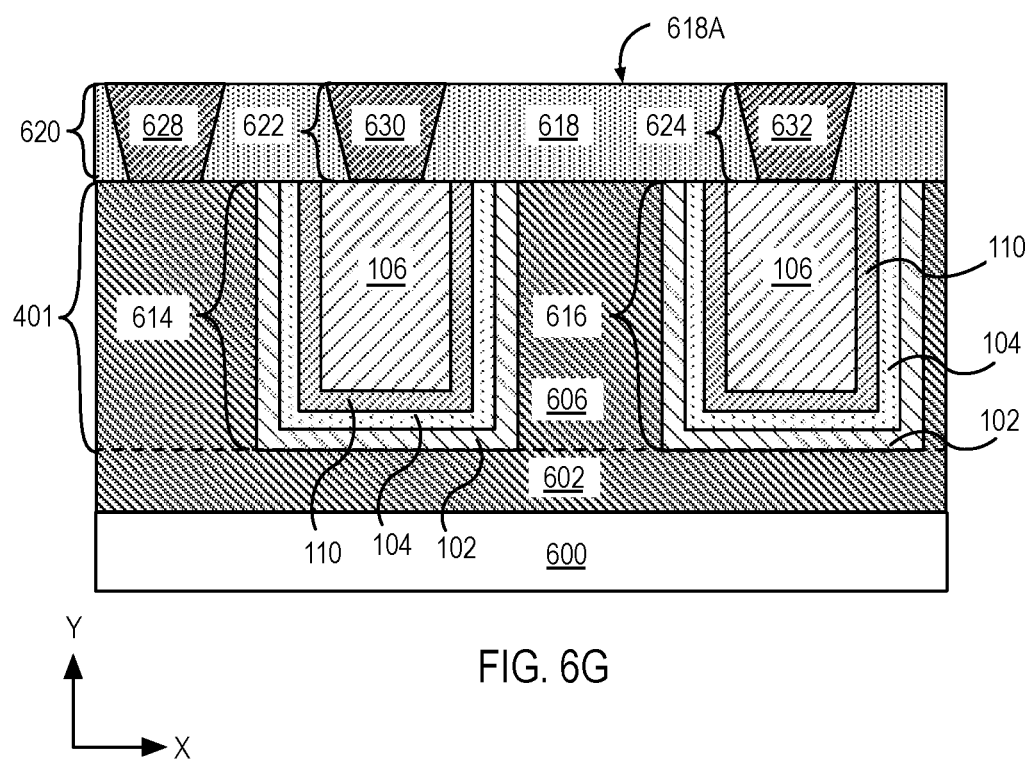
FIG. 6G illustrates the structure of FIG. 6F following the formation of via electrodes in each of the plurality of openings in the dielectric material.

FIG. 6G illustrates the structure of FIG. 6F following the formation of via electrodes, 628, 630 and 632. In an embodiment, the material of the via electrodes 628, 630 and 632 are substantially the same as the material of the via electrode 306 described in association with FIG. 3. Referring again to FIG. 6G, the material for the via electrodes 628, 630 and 632 are deposited in the openings 620, 622 and 624, on the conductive interconnect layer 606, and on the electrode layer 106 of each of the trench capacitors 614 and 616. After deposition, the material for the via electrodes 628, 630 and 632 are planarized. The planarization process removes any material for the via electrodes 628, 630 and 632 deposited above the dielectric surface 618A.

While operations associated with FIGS. 6A-6G method is described to form trench capacitors depicted in FIG. 4C, operations in conjunction the one or more operations described above may be utilized to form trench capacitor depicted in FIG. 4A.

Figure 7A:
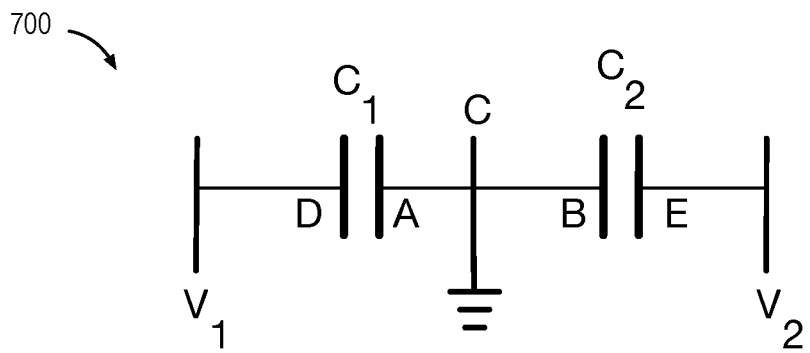
FIG. 7A illustrates an electrical diagram illustrating coupling between a pair of capacitors.

FIG. 7A illustrates a circuit diagram 700 illustrating coupling between a pair of capacitors. Decoupling capacitors depicted in this diagram may include any of the capacitors 100A, 100B, 100C, 100D, 100E, 300 and 402 described above. In an embodiment, terminals A and B of capacitor $C_1$, and $C_2$, respectively are connected at a common terminal C, which is held at a ground potential. In one embodiment, a second terminal D of capacitor C1 is connected to a first voltage $V_1$ and the second terminal E of the capacitor C2 is connected to a second voltage $V_2$. During operation, in one embodiment, $V_1$ is greater than $V_2$ and in a second embodiment $V_2$ is greater than $V_1$.

Figure 7B:
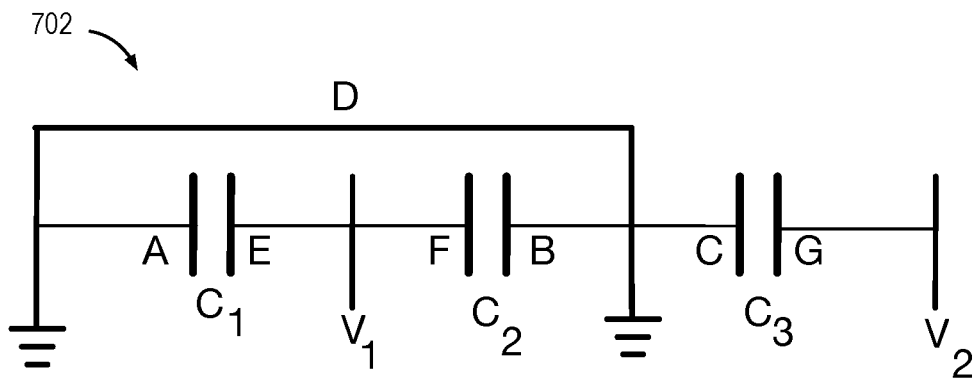
FIG. 7B illustrates an electrical diagram illustrating coupling between three capacitors.

FIG. 7B illustrates a circuit diagram 702 illustrating coupling between three capacitors $C_1$, $C_2$, and $C_3$. Decoupling capacitors $C_1$, $C_2$, and $C_3$ depicted in this diagram may include any of the capacitors 100A, 100B, 100C, 100D, 300 and 402 described above.

In an embodiment, terminals A, B and C of capacitors $C_1$, $C_2$, and $C_3$, respectively are connected to a common line D, which is further connected to grounded terminals. In one embodiment, a second terminal E of capacitor $C_1$, and a second terminal F of capacitor $C_2$ is connected to a first voltage source $V_1$. As shown a second terminal G of the capacitor $C_3$ is connected to a second voltage source $V_2$. During operation, in one embodiment, $V_1$ is greater than $V_2$ and in a second embodiment $V_2$ is greater than $V_1$.

Figure 7C:
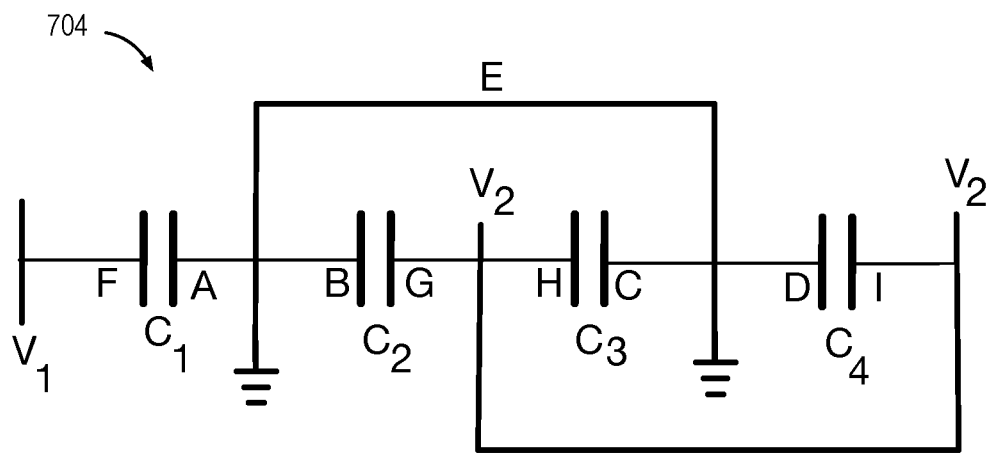
FIG. 7C illustrates an electrical diagram illustrating coupling between four capacitors.

FIG. 7C illustrates a circuit diagram 704 illustrating coupling between four capacitors. $C_1$, $C_2$, $C_3$ and $C_4$. Decoupling capacitors $C_1$, $C_2$, $C_3$ and $C_4$ depicted in this diagram may include any of the capacitors 100A, 100B, 100C, 100D, 300 and 402 described above.

In an embodiment, terminals A, B, C and D of capacitors $C_1$, $C_2$, $C_3$ and $C_4$, respectively are connected to a common line D, which is further connected to grounding terminals. In one embodiment, a second terminal F of capacitor $C_1$ is connected to a first voltage source $V_1$. As shown a second terminal G of the capacitor $C_2$, second terminal H of the capacitor $C_3$, and a second terminal "I" of the capacitor $C_3$ are each connected to a common second voltage source $V_2$. During operation, in one embodiment, $V_1$ is greater than $V_2$ and in a second embodiment $V_2$ is greater than $V_1$.

Figure 8:
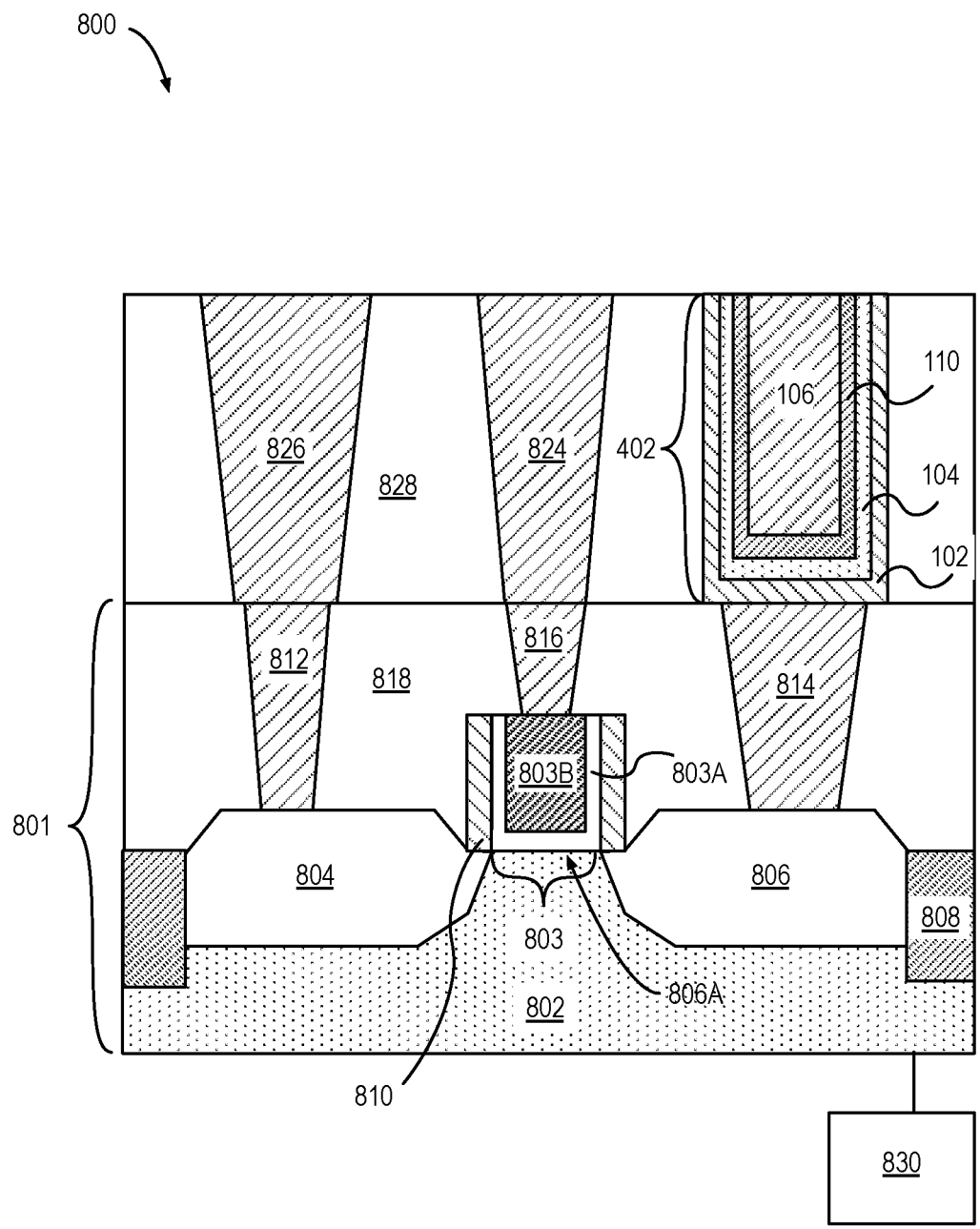
FIG. 8 illustrates a cross-sectional view of a trench capacitor coupled to a transistor.

FIG. 8 illustrates a system 800 which includes a capacitor such as capacitor 402, described in association with FIG. 4B or 4C coupled to an access transistor 801. Referring again to FIG. 8, in an embodiment, the transistor 801 is on a substrate 802 and has a gate 803, a source region 804, and a drain region 806. In the illustrative embodiment, an isolation 808 is adjacent to the source region 804, drain region 806 and portions of the substrate 802. In some implementations of the disclosure, such as is shown, a pair of sidewall spacers 810 are on opposing sides of the gate 803.

The transistor 801 further includes a gate contact 816 above and electrically coupled to the gate 803, and a drain contact 814 above and electrically coupled to the drain region 806, and a source contact 812 above and electrically coupled to the source region 804, as is illustrated in FIG. 6. The transistor 801 also includes dielectric 818 adjacent to the gate 803, source region 804, drain region 806, isolation 808, sidewall spacers 810, source contact 812, drain contact 814 and gate contact 816.

In the illustrative embodiment, the trench capacitor 402 includes a relaxor ferroelectric layer 104 and a ferroelectric layer 110. As shown the electrode 102 of the trench capacitor 402 is adjacent to a dielectric 828 and dielectric 818 and coupled to drain contact 814. In other embodiments, the trench capacitor 402 may be at a same level as the transistor 801. One or more interconnects may be connected to the electrode 102 and 106, where at least one of the electrodes 102 or 106 is electrically coupled with the drain contact 814.

Gate contact 816 and source contact 812 are each coupled with interconnects. In the illustrative embodiment, gate contact 816 is coupled with a gate interconnect 824 and the source contact 812 is coupled with a source interconnect 826. The dielectric 828 is adjacent to source interconnect 826 and gate interconnect 824. In an embodiment, the system 800 further includes a power supply 830 coupled to the transistor 801.

In an embodiment, the underlying substrate 802 represents a surface used to manufacture integrated circuits. Suitable substrate 802 includes a material such as single crystal silicon, polycrystalline silicon and silicon on insulator (SOI), as well as substrates formed of other semiconductor materials. In some embodiments, the substrate 802 is the same as or substantially the same as the substrate 600 described in association with FIG. 6A. Referring again to FIG. 8, the substrate 802 may also include semiconductor materials, metals, dielectrics, dopants, and other materials commonly found in semiconductor substrates.

In an embodiment, the transistor 801 associated with substrate 802 are metal-oxide-semiconductor field-effect transistors (MOSFET or simply MOS transistors), fabricated on the substrate 802. In some embodiments, the transistor 801 is an access transistor 801. In various implementations of the disclosure, the transistor 801 may be planar transistors, nonplanar transistors, or a combination of both. Nonplanar transistors include FinFET transistors such as double-gate transistors and tri-gate transistors, and wrap-around or all-around gate transistors such as nanowire transistors.

In some embodiments, gate 803 includes at least two layers, a gate dielectric layer 803A and a gate electrode 803B. The gate dielectric layer 803A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 803A to improve its quality when a high-k material is used.

The gate electrode 803B of the access transistor 801 of substrate 802 is formed on the gate dielectric layer 803A and may consist of at least one P-type work function metal or N-type work function metal, depending on whether the transistor is to be a PMOS or an NMOS transistor. In some implementations, the gate electrode 803B may consist of a stack of two or more metal layers, where one or more metal layers are work function metal layers and at least one metal layer is a conductive fill layer.

For a PMOS transistor, metals that may be used for the gate electrode 803B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 803B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 803B may consist of one or more U-shaped metal layers formed atop one or more planar, non-U-shaped layers.

The sidewall spacers 810 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 804 and drain region 806 are formed within the substrate adjacent to the gate stack of each MOS transistor. The source region 804 and drain region 806 are generally formed using either an implantation/diffusion process or an etching/deposition process. In the former process, dopants such as boron, aluminum, antimony, phosphorous, or arsenic may be ion-implanted into the substrate to form the source region 804 and drain region 806. An annealing process that activates the dopants and causes them to diffuse further into the substrate typically follows the ion implantation process. In the latter process, the substrate 802 may first be etched to form recesses at the locations of the source and drain regions. An epitaxial deposition process may then be carried out to fill the recesses with material that is used to fabricate the source region 804 and drain region 806. In some implementations, the source region 804 and drain region 806 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 804 and drain region 806 may be formed using one or more alternate semiconductor materials such as germanium or a group III-V material or alloy. And in further embodiments, one or more layers of metal and/or metal alloys may be used to form the source region 804 and drain region 806.

In an embodiment, the source contact 812, the drain contact 814 and gate contact 816 each include a multi-layer stack. In an embodiment, the multi-layer stack includes one or more of Ti, Ru or Al and a conductive cap on the one or more of Ti, Ta, Ru or Al. The conductive cap may include a material such as W or Cu.

In an embodiment, the source interconnect 826, gate interconnect 824, each include a multi-layer stack. In an embodiment, the multi-layer stack includes one or more of Ti, Ru or Al and a conductive cap on the one or more of Ti, Ta, Ru or Al. The conductive cap may include a material such as W or Cu.

The isolation 808 and dielectric 818 and 828 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 9:
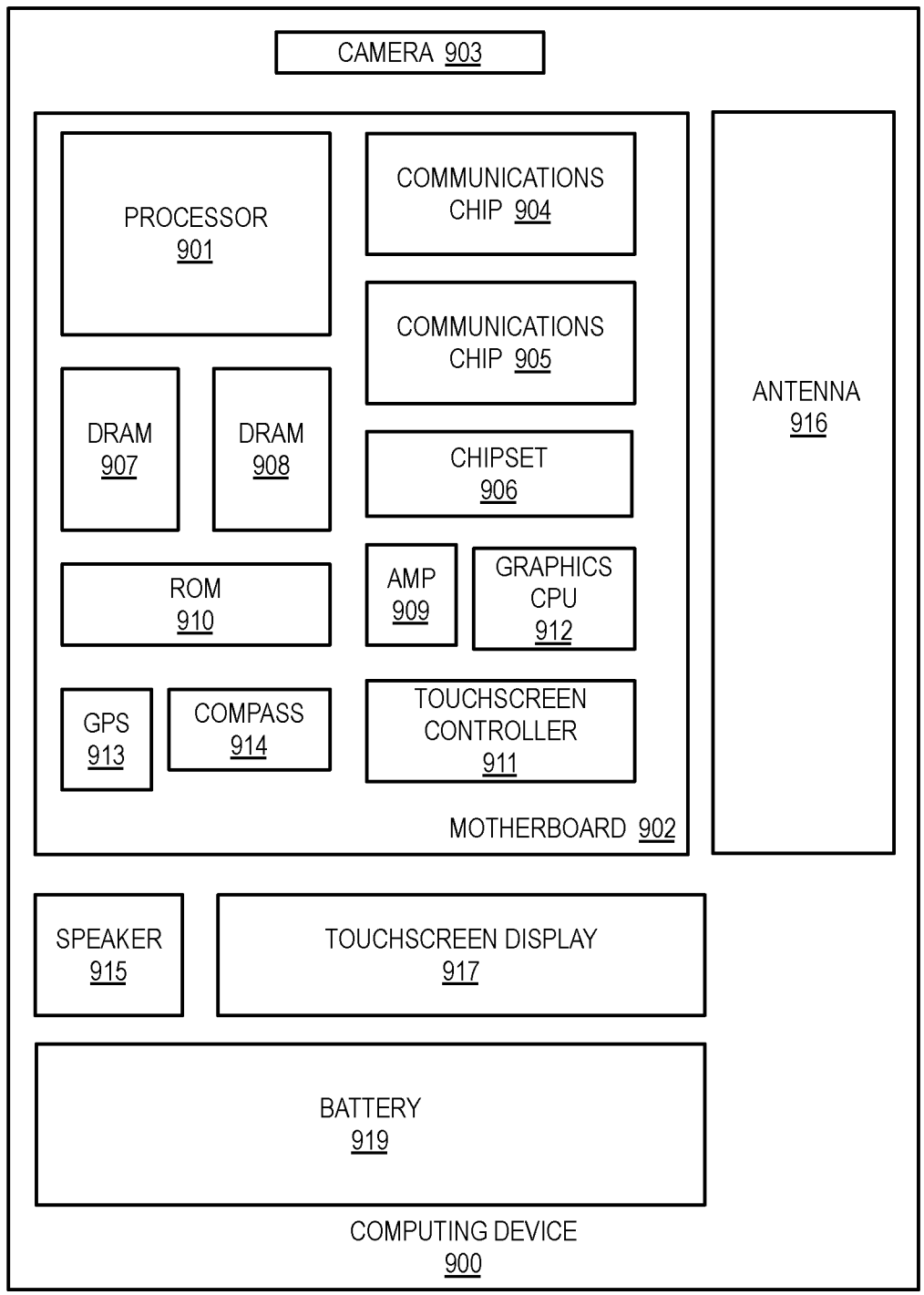
FIG. 9 illustrates a computing device in accordance with embodiments of the present disclosure.

FIG. 9 illustrates a computing device 900 in accordance with embodiments of the present disclosure. As shown, computing device 900 houses a motherboard 902. Motherboard 902 may include a number of components, including but not limited to a processor 901 and at least one communications chip 904 or 905. Processor 901 is physically and electrically coupled to the motherboard 902. In some implementations, communications chip 905 is also physically and electrically coupled to motherboard 902. In further implementations, communications chip 905 is part of processor 901.

Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset 906, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 905 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 905 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communications chips 904 and 905. For instance, a first communications chip 905 may be dedicated to shorter range wireless communications such as Wi-Fi and Bluetooth and a second communications chip 904 may be dedicated to longer range wireless communications such as GPS, EDGE, GPRS, CDMA, WiMAX, LTE, Ev-DO, and others.

Processor 901 of the computing device 900 includes an integrated circuit die packaged within processor 901. In some embodiments, the integrated circuit die of processor 901 includes one or more interconnect structures, non-volatile memory devices, and transistors coupled with capacitors such as trench capacitor 402 or 402 described in FIG. 4B or 4C. Referring again to FIG. 9, the term "processor" may refer to any device or portion of a device that processes electronic data from registers and/or memory to transform that electronic data into other electronic data that may be stored in registers and/or memory.

Communications chip 905 also includes an integrated circuit die packaged within communication chip 905. In another embodiment, the integrated circuit die of communications chips 904, 905 includes one or more interconnect structures, non-volatile memory devices, capacitors such as trench capacitor 402 or 402 described above, and transistors coupled with capacitors such as trench capacitor 402 or 402 described above. Depending on its applications, computing device 900 may include other components that may or may not be physically and electrically coupled to motherboard 902. These other components may include, but are not limited to, volatile memory (e.g., DRAM) 909, 908, non-volatile memory (e.g., ROM) 910, a graphics CPU 912, flash memory, global positioning system (GPS) device 913, compass 914, a chipset 906, an antenna 916, a power amplifier 909, a touchscreen controller 911, a touchscreen display 917, a speaker 915, a camera 903, and a battery 919, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 900 and discussed above may contain a stand-alone integrated circuit memory die that includes one or more arrays of NVM devices.

In various implementations, the computing device 900 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
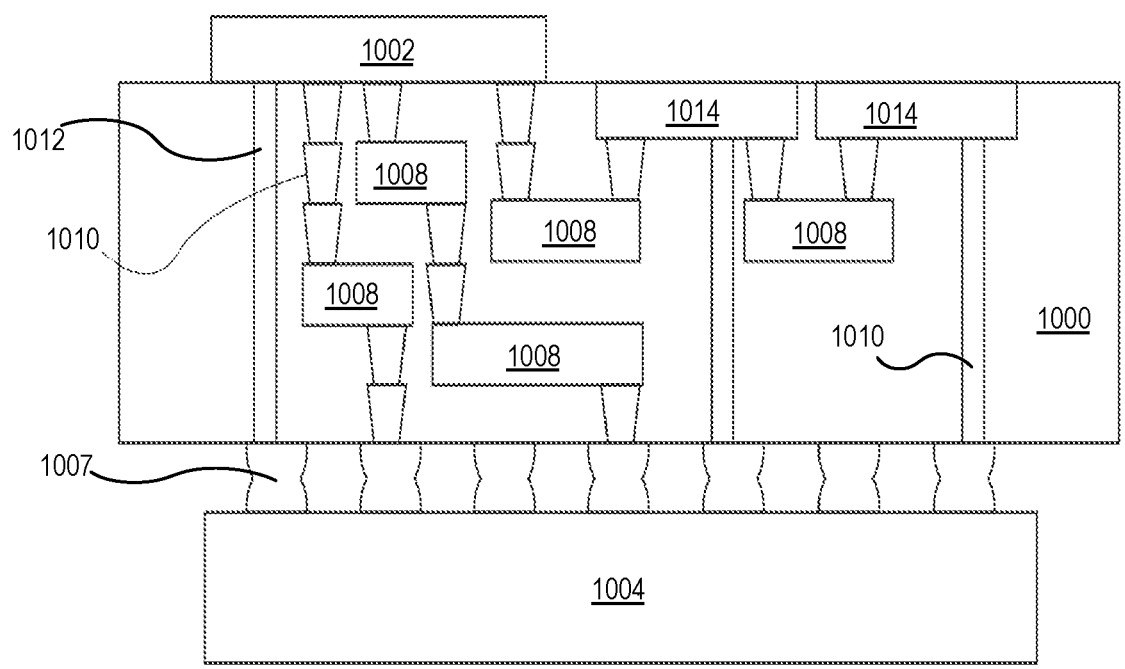
FIG. 10 illustrates an integrated circuit (IC) structure that includes one or more embodiments of the present disclosure.

FIG. 10 illustrates an integrated circuit (IC) structure 1000 that includes one or more embodiments of the disclosure. The integrated circuit (IC) structure 1000 is an intervening substrate used to bridge a first substrate 1002 to a second substrate 1004. The first substrate 1002 may be, for instance, an integrated circuit die. The second substrate 1004 may be, for instance, a memory module, a computer mother, or another integrated circuit die. Generally, the purpose of an integrated circuit (IC) structure 1000 is to spread a connection to a wider pitch or to reroute a connection to a different connection. For example, an integrated circuit (IC) structure 1000 may couple an integrated circuit die to a ball grid array (BGA) 1007 that can subsequently be coupled to the second substrate 1004. In some embodiments, the first substrate 1002 and the second substrate 1004 are attached to opposing sides of the integrated circuit (IC) structure 1000. In other embodiments, the first substrate 1002 and the second substrate 1004 are attached to the same side of the integrated circuit (IC) structure 1000. And in further embodiments, three or more substrates are interconnected by way of the integrated circuit (IC) structure 1000.

The integrated circuit (IC) structure 1000 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1008 and vias 1010, including but not limited to through-silicon vias (TSVs) 1012. The integrated circuit (IC) structure 1000 may further include embedded devices 1014, including both passive and active devices. Such embedded devices 1014 include capacitors, decoupling capacitors such as capacitors 100A, 100C, 100D, 100E, 300, 402 or 404 as described above, resistors, inductors, fuses, diodes, transformers, device structure including transistors, such as transistor 801 coupled with a with one at least capacitor 402 as described above. The integrated circuit (IC) structure 1000 may further include embedded devices 1014 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1000. In accordance with embodiments of the present disclosure, apparatuses or processes disclosed herein may be used in the fabrication of integrated circuit (IC) structure 1000.

Accordingly, one or more embodiments of the present disclosure relate generally to the fabrication of embedded microelectronic memory. The microelectronic memory may be non-volatile, wherein the memory can retain stored information even when not powered.

Thus, one or more embodiments of the present disclosure relate to capacitor devices such as capacitors 100A, 100C, 100D, 100E, 300, 402 or 404 as described above. The capacitors 100A, 100C, 100D, 100E, 300, or 402 may be used in various integrated circuit applications.

In a first example, a capacitor device comprises a first electrode having a first metal alloy or a metal oxide, a ferroelectric layer adjacent to the first electrode, where the ferroelectric layer comprises oxygen and two or more of lead, barium, manganese, zirconium, titanium, iron, bismuth, strontium, neodymium, potassium or niobium and a second electrode coupled with the ferroelectric layer, where the second electrode comprises a second metal alloy or a second metal oxide.

In second examples, for any of first examples, the ferroelectric layer comprises a combination of lead, niobium, oxygen, and one of magnesium or zirconium.

In third examples, for any of the first through second examples, the ferroelectric layer comprises a first combination of Pb, Mg, Nb and O, and a second combination of Pb, Ti and O, wherein an atomic percent of Mg and Nb in the ferroelectric layer is greater than an atomic percent of the Ti in the ferroelectric layer.

In fourth examples, for any of the first through third examples, the concentration of the first combination is up to 100% greater than the concentration of the second combination.

In sixth examples, for any of the first through fifth examples, the ferroelectric layer comprises a first combination of Pb, Mg, Nb and O, and a second combination of Ba, Ti and O, wherein an atomic percent of Pb, Mg, Nb in the ferroelectric layer is greater than an atomic percent of Ba and Ti in the ferroelectric layer.

In seventh examples, for any of the first through sixth examples, the ferroelectric layer comprises a combination of $PbMg_xNb_{1-x}O$, $BaTiO_3$, $PbTiO_3$, and $BiFeO_3$.

In eighth examples, for any of the first through seventh examples, the ferroelectric layer comprises a first combination of Pb, Mg, Nb and O, and a second combination of Pb, Zr and O, wherein an atomic percent of Mg, Nb in the ferroelectric layer is greater than an atomic percent of Zr in the ferroelectric layer.

In ninth examples, for any of the first through eighth examples, the ferroelectric layer has a thickness between 5 nm and 50 nm.

In tenth examples, for any of the first through ninth examples, the ferroelectric layer comprises a combination of an oxide of Ba, an oxide of Ti, and an oxide of Nd.

In eleventh examples, for any of the first through tenth examples, the ferroelectric layer is a first ferroelectric layer 104 and the capacitor device further comprises a second ferroelectric layer 110 between the first ferroelectric layer and the first electrode or the second electrode.

In twelfth examples, for any of the first through eleventh examples, the second ferroelectric layer comprises oxygen and two or more of lead, barium, manganese, zirconium, titanium, iron, bismuth, neodymium, strontium or niobium, and wherein the material of the first ferroelectric layer is different from the material of the second ferroelectric layer.

In thirteenth examples, for any of the first through twelfth examples, the second ferroelectric layer comprises hafnium, oxygen and doped with one or more of Zr, Al, Si, N, Y or La.

In a fourteenth example, the first ferroelectric layer has a dielectric constant between 100-2200 and the second ferroelectric layer has a dielectric constant between 20-50.

In fifteenth examples, for any of the fourteenth examples, the first ferroelectric layer has a thickness between 4 nm and 49 nm and the second ferroelectric layer has a thickness between 1 nm and 46 nm wherein a combined sum of the thickness of the first ferroelectric layer and the second ferroelectric layer is between 5 nm and 50 nm.

In sixteenth examples, a capacitor device comprises a first electrode comprising a first metal alloy or a metal oxide, a multilayer stack adjacent the first electrode, the multilayer stack comprising a bilayer stack. The bilayer stack comprises one of a first relaxor or first non-relaxor ferroelectric layer including oxygen and two or more of lead, barium, manganese, zirconium, titanium, iron, bismuth, strontium, neodymium, or niobium and one of a second relaxor or second non-relaxor ferroelectric layer on the one of the first relaxor or the first non-relaxor ferroelectric layer. The multilayer stack further comprises a third relaxor ferroelectric layer on the bilayer stack, wherein the third relaxor ferroelectric layer comprises a material that is substantially the same as the material of the first ferroelectric layer a second electrode coupled with the third relaxor ferroelectric layer, the second metal alloy.

In seventeenth examples, for any of the sixteenth example, the multilayer stack comprises multiple bilayers, wherein a number of the multiple bilayers is in a range from 1 to 10, wherein the material layer stack has a thickness between 5 nm and 50 nm, and wherein the bilayer stack has a thickness between 4 nm and 49 nm and the third relaxor ferroelectric layer comprises a thickness of at least 1 nm.

In eighteenth examples, for any of the fourteenth through seventeenth examples, the third relaxor ferroelectric layer comprises a material that is substantially the same as a material of the first ferroelectric layer.

In nineteenth examples, a system comprises a transistor above a substrate. The transistor comprises a drain contact coupled to a drain, a source contact coupled to a source, a gate contact coupled to a gate, wherein the gate is between the gate contact and the drain contact and a bottom electrode coupled to the drain contact. The system further comprises a capacitor device coupled with the drain terminal of the transistor. The capacitor device comprises a first electrode having a first metal alloy or a metal oxide, a ferroelectric layer adjacent to the first electrode, where the ferroelectric layer comprises oxygen and two or more of lead, barium, manganese, zirconium, titanium, iron, bismuth, strontium, neodymium, or niobium and a second electrode coupled with the ferroelectric layer, where the second electrode comprises a second metal alloy or a second metal oxide.

In twentieth example, for any of the nineteenth example, the ferroelectric layer comprises a combination of lead, magnesium, niobium and oxygen or a combination of lead, zirconium, niobium and oxygen, and wherein the transistor is coupled to a power supply.

In twenty first examples, the system comprises an integrated circuit, where the integrated circuit comprises a capacitor device. The capacitor device comprises a first electrode, including a first metal alloy or a metal oxide, a ferroelectric layer adjacent the first electrode, the ferroelectric layer including oxygen and two or more of lead, barium, manganese, zirconium, titanium, iron, bismuth, strontium, neodymium, or niobium, and a second electrode coupled with the ferroelectric layer, the second metal alloy comprising a second metal alloy or a second metal oxide. The system further comprises a display device coupled to the integrated circuit, the display device to display an image based on a signal communicated with the integrated circuit.

In twenty-first example, for any of the twentieth example, the ferroelectric layer comprises a combination of lead, magnesium, niobium and oxygen or a combination of lead, zirconium, niobium and oxygen.

What is claimed is:

1. A capacitor device, comprising:
a first electrode comprising a first metal alloy or a first metal oxide;
a ferroelectric layer coupled with the first electrode, the ferroelectric layer comprising a combination of bismuth, sodium, titanium, and oxygen; and
a second electrode coupled with the ferroelectric layer, the second electrode comprising a second metal alloy or a second metal oxide.

2. The capacitor device of claim 1, wherein the ferroelectric layer comprises a second combination of barium, titanium, and oxygen.

3. The capacitor device of claim 2, wherein the ferroelectric layer comprises a third combination of potassium, niobium, sodium, and oxygen.

4. The capacitor device of claim 2, wherein the ferroelectric layer comprises a third combination of one of niobium, tantalum, or antimony and oxygen.

5. The capacitor device of claim 2, wherein the ferroelectric layer comprises a third combination of strontium, titanium, and oxygen.

6. The capacitor device of claim 1, wherein the ferroelectric layer comprises a second combination of bismuth, potassium, titanium, and oxygen.

7. The capacitor device of claim 1, wherein the combination further comprises potassium.

8. The capacitor device of claim 7, wherein the ferroelectric layer comprises a second combination of barium, zirconium, and oxygen.

9. The capacitor device of claim 1, wherein the ferroelectric layer comprises a second combination of potassium, sodium, niobium, and oxygen.

10. The capacitor device of claim 1, wherein the ferroelectric layer has a thickness between 5 and 50 nm.

11. The capacitor device of claim 1, wherein the ferroelectric layer is a first ferroelectric layer and the capacitor device further comprises a second ferroelectric layer between the first ferroelectric layer and the first electrode or the second electrode.

12. The capacitor device of claim 11, wherein the first ferroelectric layer is a relaxor ferroelectric material and the second ferroelectric layer is a non-relaxor ferroelectric material.

13. A capacitor device, comprising:
a first electrode comprising a first metal alloy or a first metal oxide;
a multilayer stack adjacent the first electrode, the multilayer stack comprising:
a bilayer stack comprising a first ferroelectric layer, the first ferroelectric layer comprising a first relaxor ferroelectric material comprising a combination of bismuth, sodium, titanium, and oxygen and a second ferroelectric layer on the first relaxor ferroelectric layer; and
a third ferroelectric layer on the bilayer stack, the third ferroelectric layer comprising a second relaxor ferroelectric material that is substantially the same as the first relaxor ferroelectric material; and
a second electrode coupled with the third relaxor ferroelectric layer, the second electrode comprising a second metal alloy or a second metal oxide.

14. The capacitor device of claim 13, wherein the multilayer stack comprises multiple bilayer stacks.

15. The capacitor device of claim 13, wherein the first relaxor ferroelectric material comprises a second combination of barium, titanium, and oxygen.

16. A system comprising:
- an integrated circuit comprising a capacitor device comprising:
  - a first electrode comprising a first metal alloy or a first metal oxide;
  - a ferroelectric layer coupled with the first electrode, the ferroelectric layer comprising a combination of bismuth, sodium, titanium, and oxygen; and
  - a second electrode coupled with the ferroelectric layer, the second electrode comprising a second metal alloy or a second metal oxide; and
- a display device coupled to the integrated circuit, the display device to display an image based on a signal communicated with the integrated circuit.

17. The system of claim 16, wherein the ferroelectric layer comprises a second combination of barium, titanium, and oxygen.

18. The system of claim 17, wherein the ferroelectric layer comprises a third combination of potassium, niobium, sodium, and oxygen.

19. The system of claim 17, wherein the ferroelectric layer comprises a third combination of one of niobium, tantalum, or antimony and oxygen.

20. The system of claim 17, wherein the ferroelectric layer comprises a third combination of strontium, titanium, and oxygen.

* * * * *